United States Patent
Zhan et al.

(10) Patent No.: US 8,921,942 B2
(45) Date of Patent: Dec. 30, 2014

(54) METHODS FOR PRODUCING STACKED ELECTROSTATIC DISCHARGE CLAMPS

(75) Inventors: Rouying Zhan, Gilbert, AZ (US); Amaury Gendron, Scottsdale, AZ (US); Chai Ean Gill, Chandler, AZ (US)

(73) Assignee: Freescale Semiconductor Inc., Austin, TX (US)

( * ) Notice: Subject to any disclaimer, the term of this patent is extended or adjusted under 35 U.S.C. 154(b) by 163 days.

(21) Appl. No.: 13/561,990

(22) Filed: Jul. 30, 2012

(65) Prior Publication Data

US 2012/0295414 A1 Nov. 22, 2012

Related U.S. Application Data

(62) Division of application No. 12/689,666, filed on Jan. 19, 2010, now Pat. No. 8,242,566.

(51) Int. Cl.
*H01L 27/02* (2006.01)

(52) U.S. Cl.
CPC .................................. *H01L 27/0259* (2013.01)
USPC ....................................................... 257/355

(58) Field of Classification Search
CPC ............ H01L 29/0821; H01L 29/1004; H01L 29/66234; H01L 29/73; H01L 29/735; H01L 29/6625; H01L 27/0259; H01L 27/0623; H01L 27/082; H01L 29/0808; H01L 29/1008; H01L 23/60; H01L 29/36; H01L 21/2253
USPC .................................................. 438/309–370
See application file for complete search history.

(56) References Cited

U.S. PATENT DOCUMENTS

| | | | |
|---|---|---|---|
| 6,927,442 B2 * | 8/2005 | Kaneko et al. | 257/299 |
| 7,303,968 B2 * | 12/2007 | Dunn et al. | 438/318 |
| 7,601,990 B2 | 10/2009 | Glenn | |
| 7,701,012 B2 | 4/2010 | Xu et al. | |
| 2001/0015470 A1 * | 8/2001 | Gregory | 257/511 |
| 2002/0030244 A1 * | 3/2002 | Pruijmboom et al. | 257/565 |
| 2006/0220137 A1 * | 10/2006 | Kuroda et al. | 257/361 |
| 2007/0278515 A1 * | 12/2007 | Hurst | 257/173 |

(Continued)

OTHER PUBLICATIONS

Vashchenko, V., et al., Stacked BSCR ESD Protection for 250V Tolerant Circuits, Proceedings of 2004 International Symposium on Power Semiconductor Devices & ICs, Kitakyushu, pp. 225-228.

(Continued)

*Primary Examiner* — Minh-Loan Tran
*Assistant Examiner* — Herve Assouman
(74) *Attorney, Agent, or Firm* — Ingrassia Fisher & Lorenz, P.C.

(57) ABSTRACT

Methods are provided for producing stacked electrostatic discharge (ESD) clamps. In one embodiment, the method includes providing a semiconductor substrate in which first and second serially-coupled transistors are formed. The first transistor includes a first well region having a first lateral edge partially forming the first transistor's base. The second transistor including a second well region having a second lateral edge partially forming the second transistor's base. Third and fourth well regions are formed in the first and second transistors, respectively, and extend a different distance into the substrate than do the well regions of the first and second transistors. The third well region has a third lateral edge separated from the first lateral edge by a first spacing dimension D1. The fourth well region has a fourth lateral edge separated from the second lateral edge by a second spacing dimension D2, which is different than D1.

19 Claims, 11 Drawing Sheets

(56) References Cited

U.S. PATENT DOCUMENTS

2008/0044955 A1* 2/2008 Salcedo et al. ............... 438/140
2010/0044834 A1* 2/2010 Park et al. .................... 257/572
2010/0244088 A1 9/2010 Whitfield et al.
2010/0320501 A1 12/2010 Gendron et al.
2011/0101444 A1* 5/2011 Coyne et al. .................. 257/328

OTHER PUBLICATIONS

USPTO "Notice of Allowance" mailed Nov. 15, 2012; U.S. Appl. No. 12/956,686, filed Nov. 20, 2010.

* cited by examiner

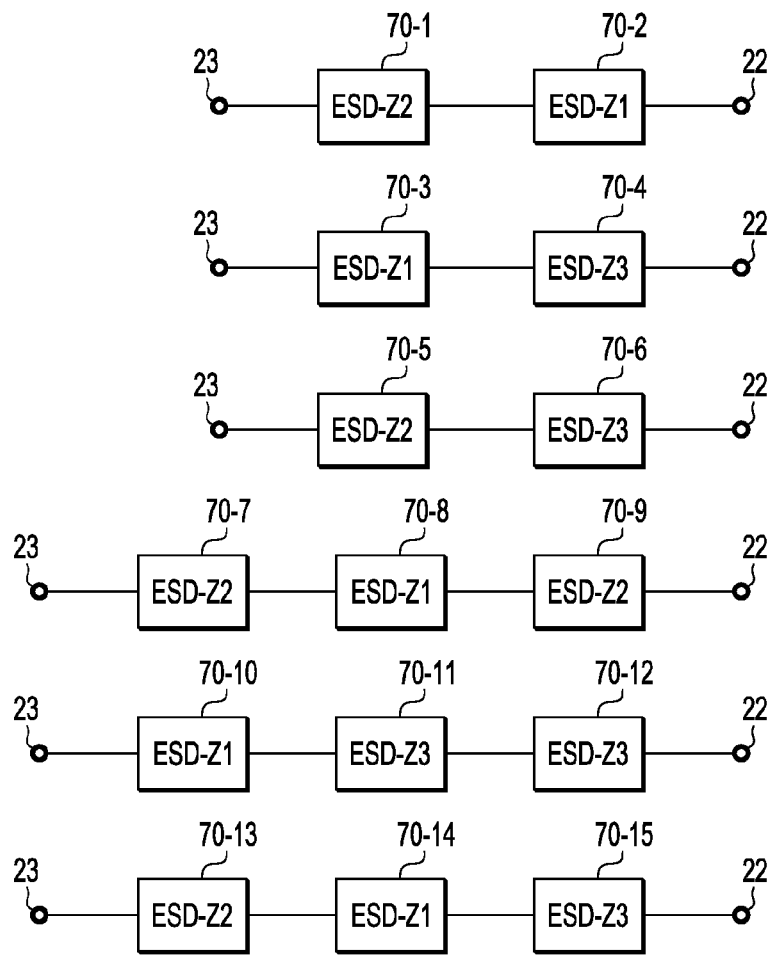
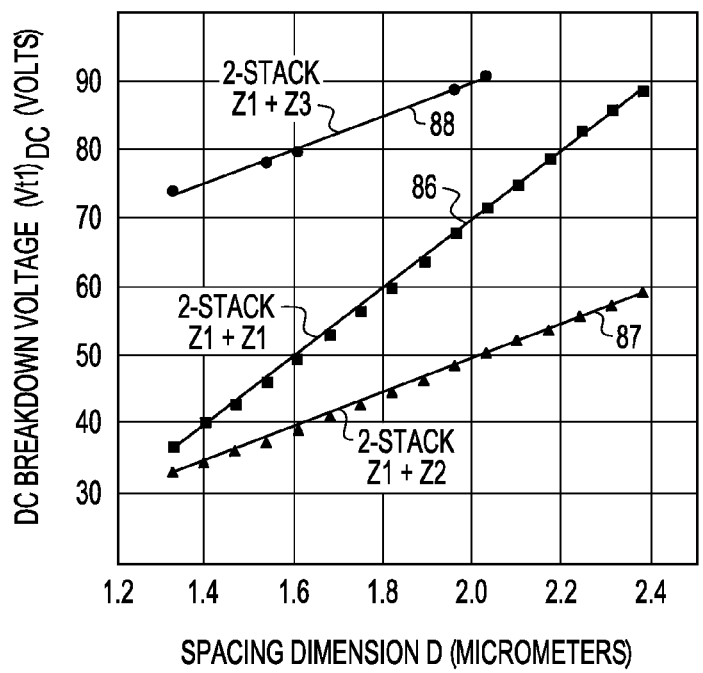

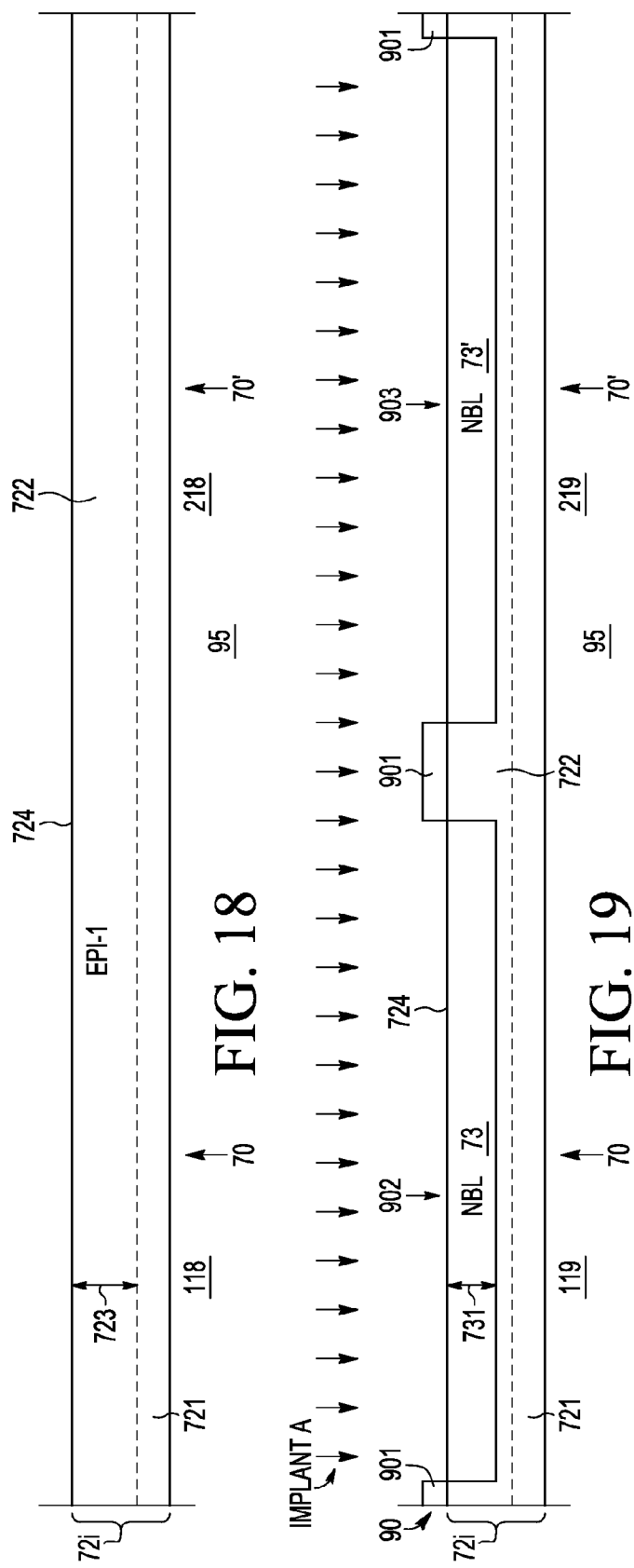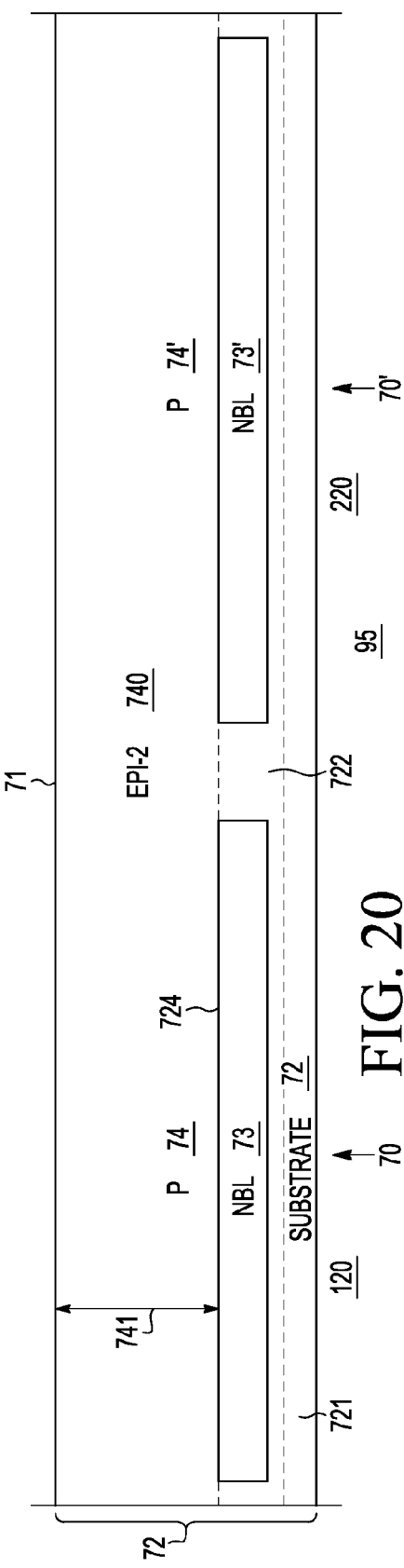

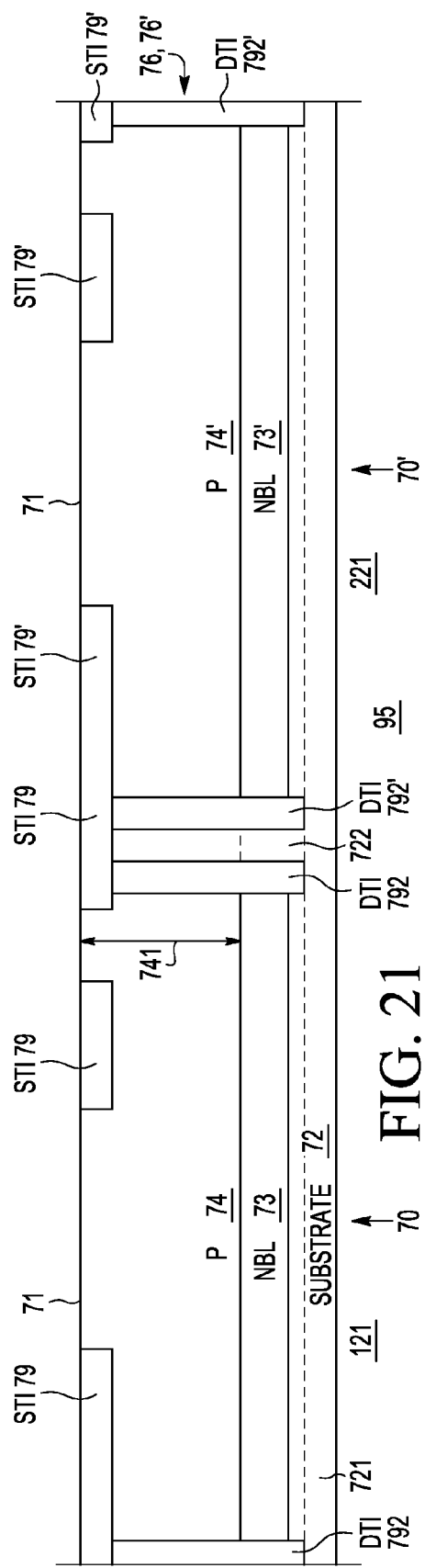
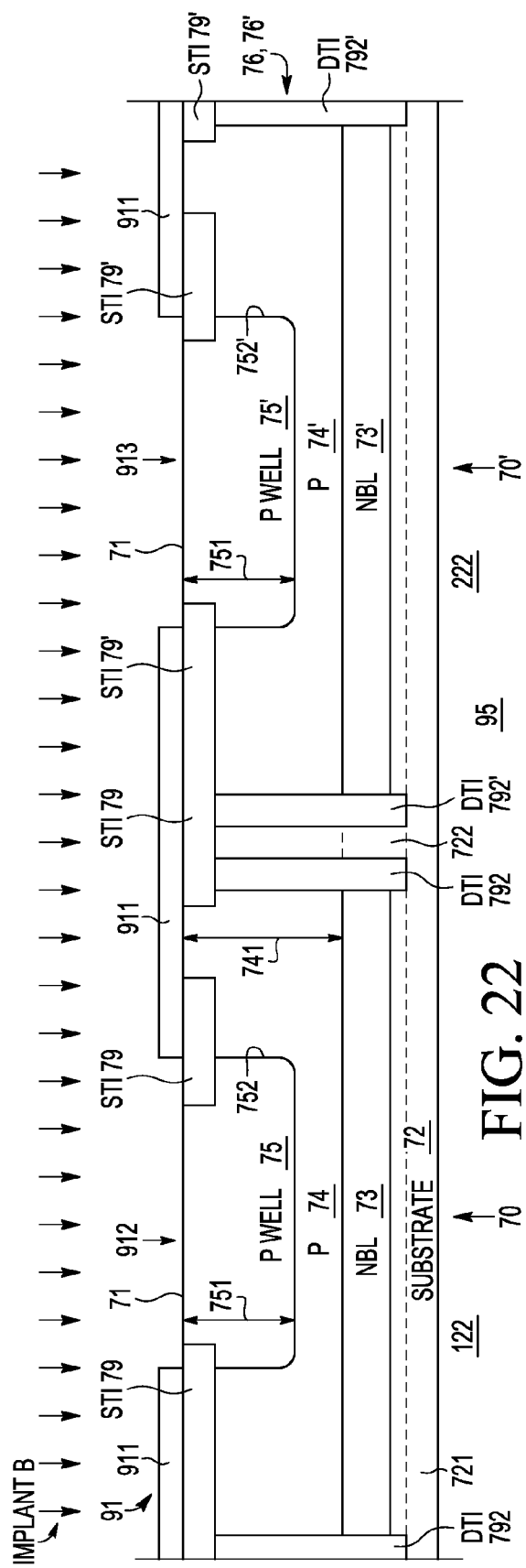
FIG. 21
FIG. 22

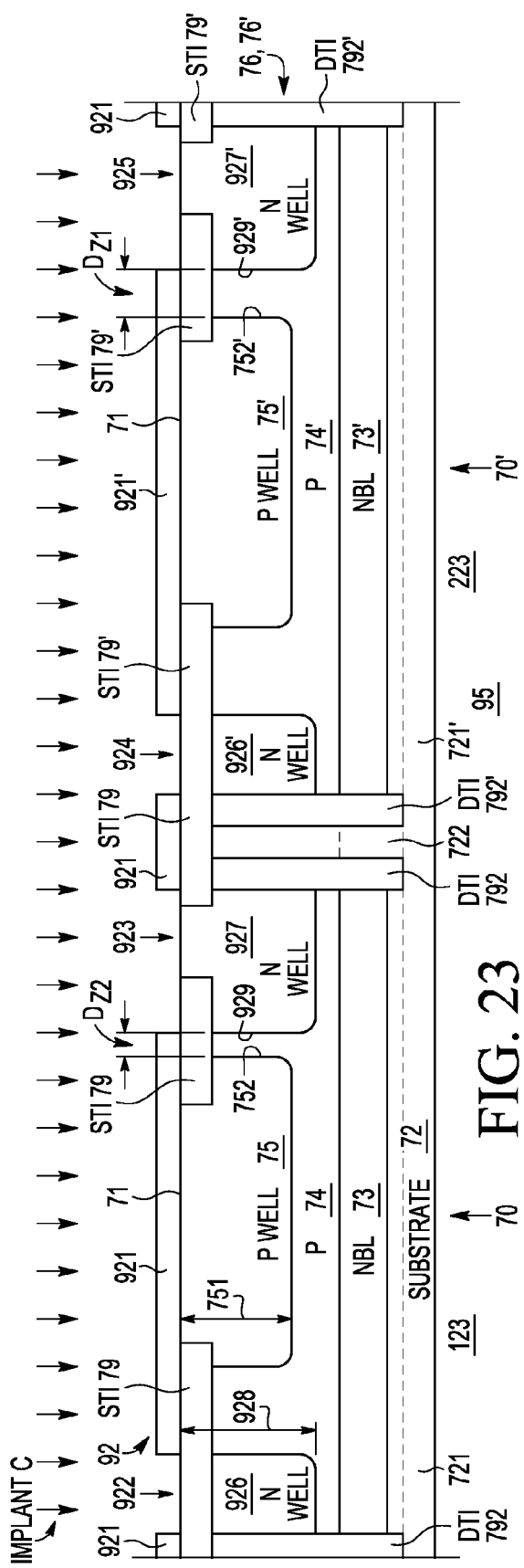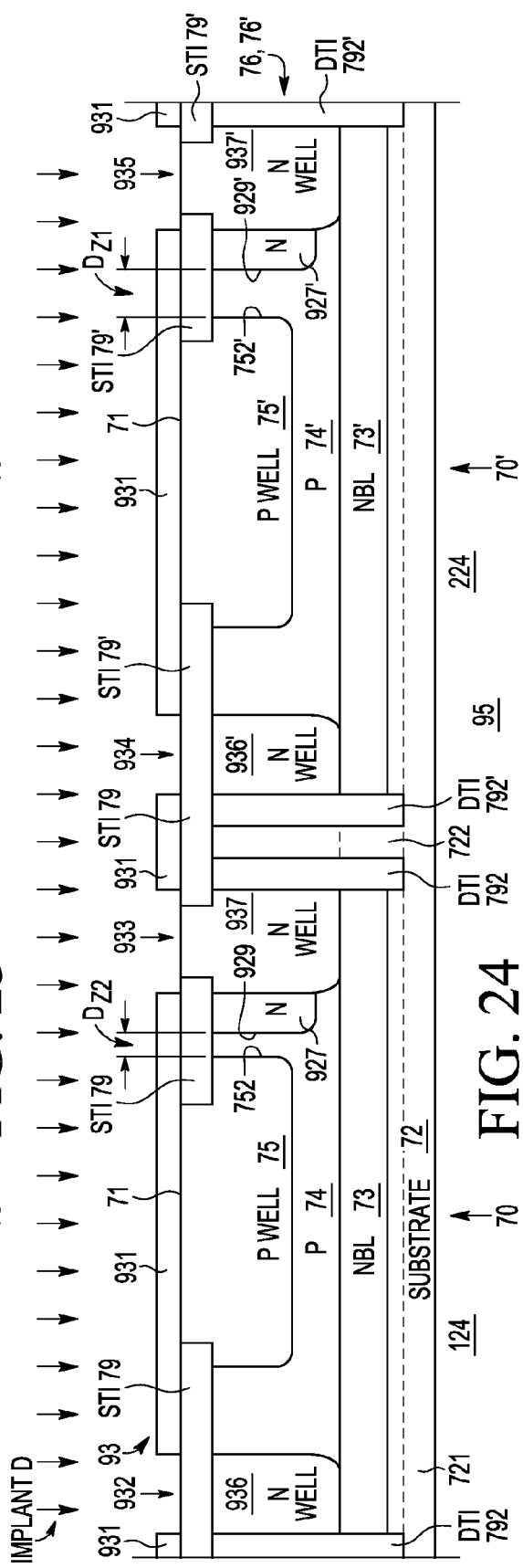

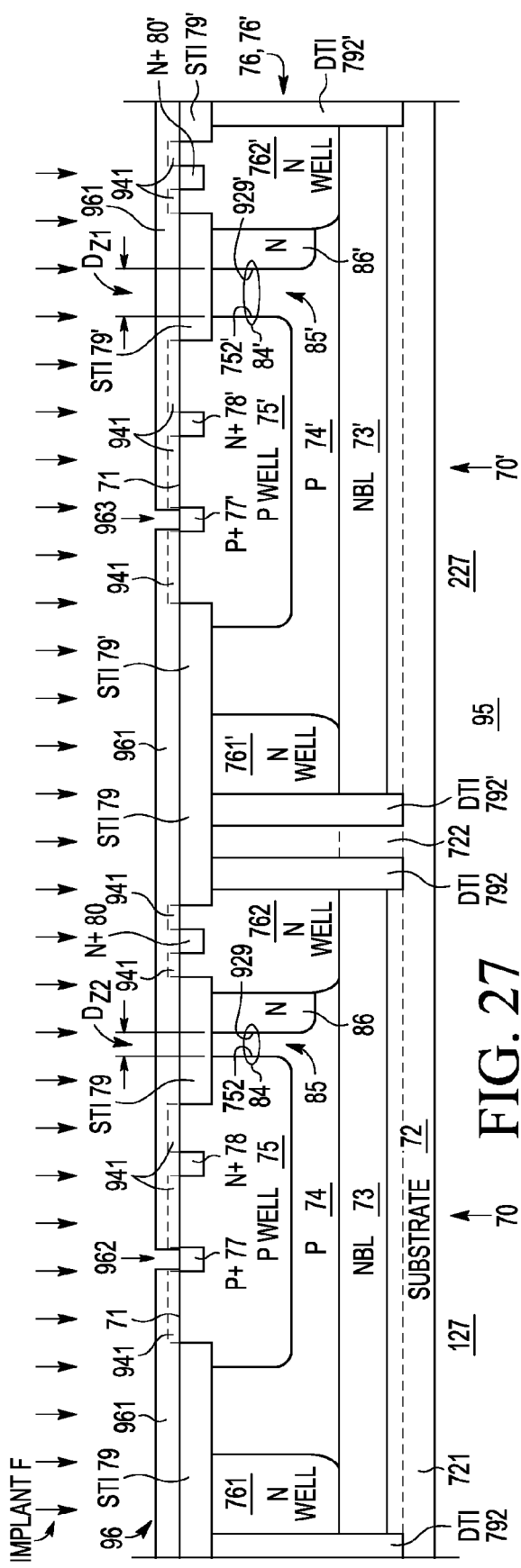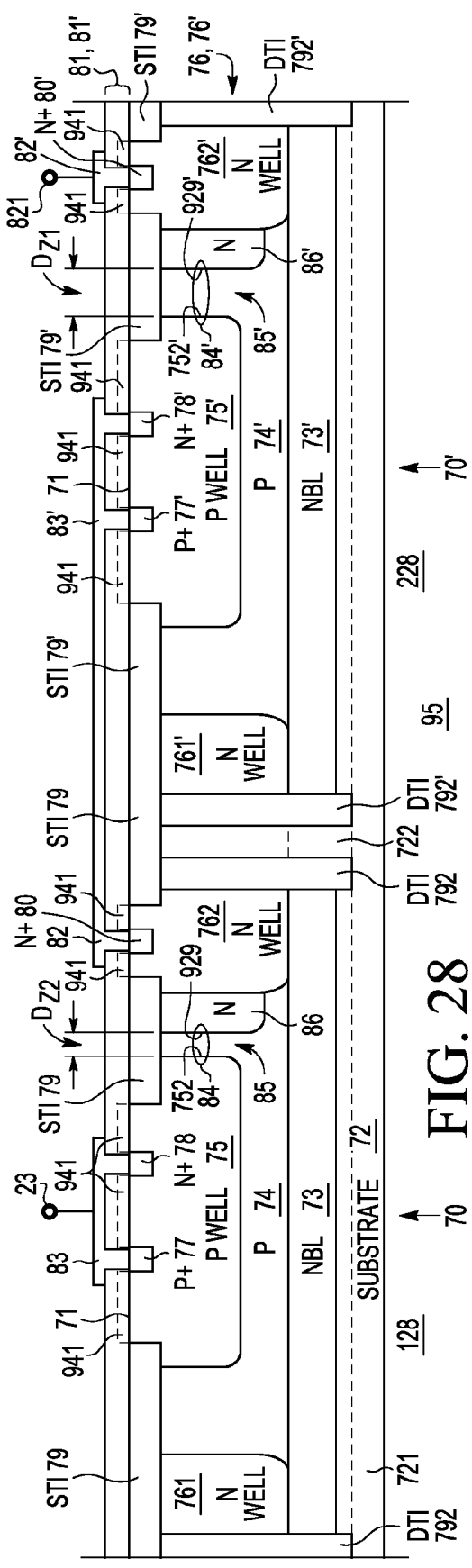

US 8,921,942 B2

METHODS FOR PRODUCING STACKED ELECTROSTATIC DISCHARGE CLAMPS

CROSS-REFERENCE TO RELATED APPLICATION

This application is a divisional of co-pending U.S. application Ser. No. 12/689,666, filed Jan. 19, 2010.

TECHNICAL FIELD

The present invention generally relates to semiconductor devices and methods for fabricating semiconductor devices, and more particularly relates to semiconductor devices used for electrostatic discharge (ESD) protection in integrated and other circuits.

BACKGROUND

Modern integrated circuits (ICs) and the devices therein are at risk of damage due to electrostatic discharge (ESD) events. This is well known in the art. Accordingly, it is commonplace to provide an ESD clamp (voltage limiting device) across the input and/or other terminals of such devices and IC's. FIG. 1 is a simplified schematic diagram of circuit 20 wherein ESD clamp 21 is placed, for example, between input-output (I/O) terminal 22 and ground or common terminal 23 of an IC to protect other devices on the chip, that is, to protect "circuit core" 24 also coupled to I/O and common terminals 22, 23. Person of skill in the art will understand that ESD clamp 21 may be placed across any terminals of the IC or other device or circuit, and reference herein to I/O terminals is intended to include any and all other terminals not merely those used for input or output signals. Further, the Zener diode illustrated in block 21 of FIG. 1 is merely for convenience of identifying the voltage limiting function of ESD block 21 and not intended to imply that a Zener diode is present therein.

FIG. 2 is a simplified schematic diagram illustrating internal components of ESD clamp 21 utilizing bipolar transistor 25, having emitter 26, collector 27, base 28, and internal resistance 29. When the voltage across terminals 22, 23 rises beyond a predetermined limit, bipolar transistor 25 turns on, limiting the voltage across terminals 22, 23, desirably to a level below that capable of damaging circuit core 24.

FIG. 3 shows simplified plot 30 of transmission line pulse current (I) versus voltage (V) for a typical electrostatic discharge (ESD) protection device such as, for example, the device of FIG. 2. As the applied voltage is increased, very little current flows until triggering voltage 31 is reached at voltage Vt1. Once triggered into operation, the ESD device conducts and the current increases to holding point 32 with current Ih and voltage Vh. Depending upon the internal impedance of the voltage source, current and voltage may further increase to point 33 at current It2 and voltage Vt2, beyond which destructive failure may occur leading to further current increase accompanied by voltage decrease.

Electrostatic discharge (ESD) protection devices are intended to remain quiescent during normal operation of the associated semiconductor (SC) device(s) or non-SC device(s) or integrated circuit (IC) (i.e., the protected element(s) of circuit core 24) having a normal operating voltage Vo, but turn on when excessive voltage arises, thereby preventing damage to the protected element(s). The triggering voltage Vt1 of the ESD device should exceed the maximum normal DC operating voltage Vo(MAX) of the protected elements, otherwise the ESD device will interfere with normal operation of the protected elements. Further, Vt1 should be less than, for example, a voltage $V_{TR}$ (usually a transient voltage) large enough to damage the protected element(s), hereafter referred to as the protected element break-down voltage, abbreviated as $V_{TR}$(PEBD). Thus, the ESD device should be designed so that Vo(MAX)<Vt1<$V_{TR}$(PEBD).

BRIEF DESCRIPTION OF THE DRAWINGS

The present invention will hereinafter be described in conjunction with the following drawing figures, wherein like numerals denote like elements, and wherein:

FIGS. 6-7 are simplified schematic diagrams of serially cascaded (e.g., stacked) ESD transistors of the type illustrated in FIG. 4 but with spacing dimensions D limited to zone Z1 of FIG. 5, wherein FIG. 6 shows a 2-stack and FIG. 7 shows a 3-stack;

FIGS. 10-15 show simplified schematic diagrams of serially cascaded stacks of ESD transistors, wherein FIGS. 10-12 show 2-stack combinations and FIGS. 13-15 show 3-stack combinations, according to still further embodiments of the present invention;

FIG. 16 is a simplified plot of DC breakdown voltage in volts as a function of lateral base-collector spacing dimension D in micrometers for different 2-stacks of cascaded ESD transistors, comparing the results for 2-stacks having different dimensions D within the stack according to yet further embodiments of the present invention;

FIGS. 18-28 are simplified cross-sectional views of an ESD clamp of the type illustrated in FIG. 9 during various stages of manufacture according to still yet further embodiments of the present invention and showing additional detail.

DETAILED DESCRIPTION

Figure 1:
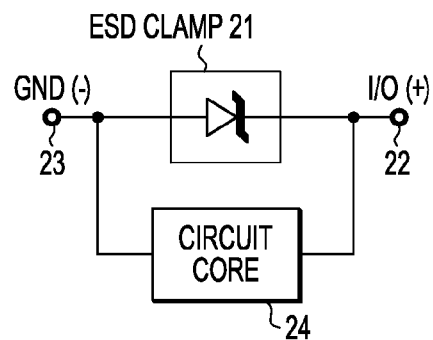
FIG. 1 is a simplified schematic diagram of a circuit wherein an ESD clamp is placed between an input-output (I/O) terminal and a ground or common terminal of an IC or other circuit to protect other devices on the chip, that is, the "circuit core" coupled to the I/O terminals.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" is intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as for example and not intended to be limiting, semiconductor-on-insulator (SOI) structures, and combinations thereof. The term "semiconductor" is abbreviated as "SC." For convenience of explanation and not intended to be limiting, semiconductor devices and methods of fabrication are described herein for silicon semiconductors but persons of skill in the art will understand that other semiconductor materials may also be used. Additionally, various device types and/or doped SC regions may be identified as being of N type or P type, but this is merely for convenience of description and not intended to be limiting, and such identification may be replaced by the more general description of being of a "first conductivity type" or a "second, opposite conductivity type" where the first type may be either N or P type and the second type then is either P or N type.

Figure 2:
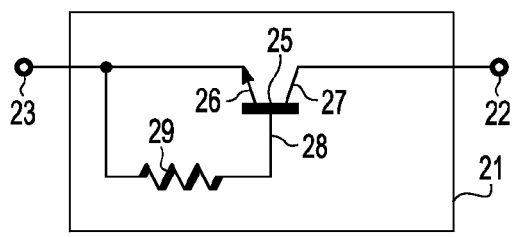
FIG. 2 is a simplified schematic diagram illustrating the internal components of the ESD clamp of FIG. 1.
Figure 3:
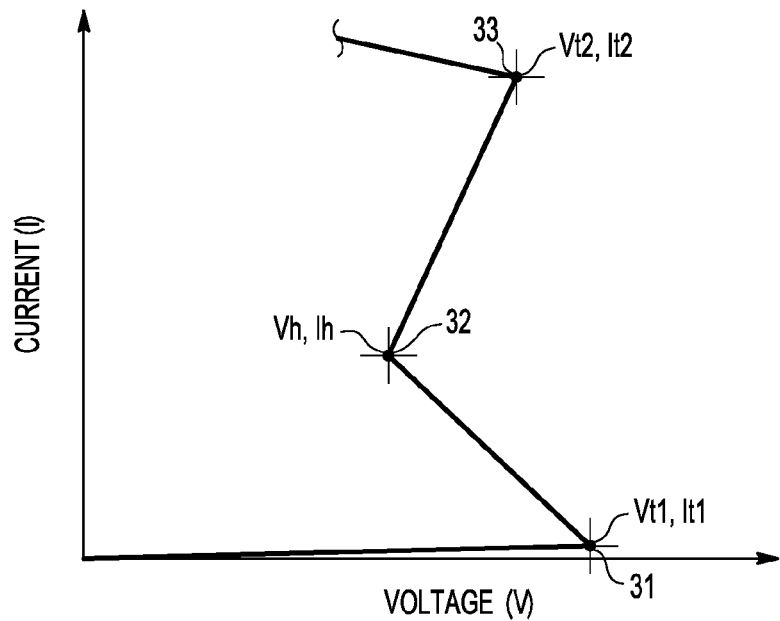
FIG. 3 is a simplified plot of current versus voltage for an electrostatic discharge (ESD) protection device, such as the device of FIG. 2.

In order to be able to build ESD devices that have different Vt1 values to meet the protection needs of different core circuits 24 see FIG. 1), it is common to design ESD devices such that Vt1 depends upon the spacing of a particular device dimension. For example, bipolar transistor 25 of FIG. 2 is often a lateral transistor wherein Vt1 depends upon a base-collector spacing dimension D. Transistor 40 of FIG. 4 (described below) illustrates a lateral transistor having base-collector spacing dimension D. One of the difficulties of using bipolar transistors such as bipolar transistor 25, 40 in ESD applications is that there can be significant variation ΔD in base-collector spacing dimension D across a wafer and/or SC die as a function, for example, of the azimuthal orientation of transistor 25, 40 on the wafer or die. In addition, the spacing dimension D can have significant variation ΔD from one wafer to another, e.g. between manufacturing different lots. This has the result that Vt1 of nominally identical devices can be different in different regions of the same IC and from manufacturing lot to manufacturing lot, depending, for example, on their relative azimuthal orientation on the IC die or wafer. This Vt1 variation can adversely affect overall manufacturing yield and is not desirable. Various process modifications may be used to minimize such effect, but such modifications are often accompanied by an undesirable increase in manufacturing cost or other difficulties. The Vt1 variation can become especially acute when such ESD clamp transistors are cascaded, that is, serially coupled in stacks in order to obtain higher vales of Vt1 than can be provided by single ESD clamp transistor 25, 40.

There is an ongoing need to provide improved ESD clamps that operate at more consistent trigger voltages Vt1 independent of their location or orientation on a particular IC, especially stacks of ESD clamps adapted to provide higher values of Vt1 than can be obtained with single ESD transistor 25. Further, it is desirable that the improved ESD clamps be obtainable without significant modification of the manufacturing process used for forming the clamps and the associated circuit core of the IC. Furthermore, other desirable features and characteristics of the present invention will become apparent from this detailed description of the invention and the appended claims herein, taken in conjunction with the accompanying drawings and the background of the invention.

Figure 4:
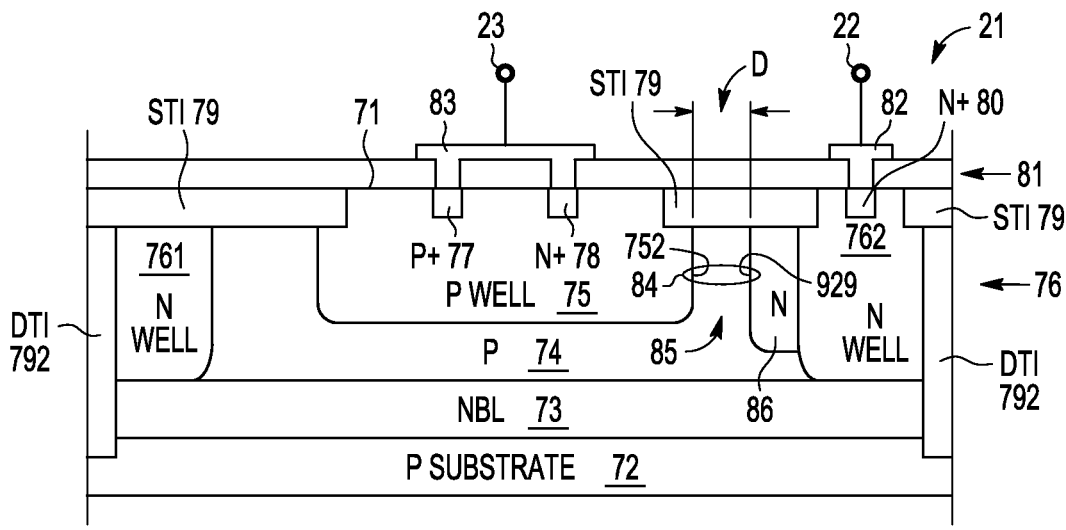
FIG. 4 shows a simplified cross-sectional view of an ESD clamp implemented in a semiconductor substrate and suitable for use in the circuits of FIGS. 1-2, according to an embodiment of the present invention.

FIG. 4 shows a simplified cross-sectional view of ESD clamp transistor 40, 70 implemented in semiconductor substrate 72 according to an embodiment of the present invention. Transistor 40, 70 fulfills the function of transistor 25 in FIG. 2 and ESD clamp 21 in FIG. 1. Transistor 40, 70 is formed in substrate 72 (e.g. P) having upper surface 71 and with N type buried layer (NBL) region 73 therein. Overlying NBL 73 is region 74 (e.g., P) extending from NBL 73 to surface 71 and within which are formed shallow trench isolation (STI) regions 79, deep trench isolation (DTI) regions 792, N WELL regions 761, 762 (collectively 76) with contact region 80 (e.g., N+) and P WELL region 75. Doped contact region 77 (e.g., P+) is provided in P WELL region 75 to make Ohmic contact to P WELL region 75. P WELL region 75 is generally somewhat more heavily doped than P region 74. Doped region 78 (e.g., N+) in P WELL region 75 serves as the emitter, P WELL region 75 (with portion 85 of P region 74) serves as the base, and N WELL region 762 with N+ contact region 80 serves as the collector of transistor 40, 70. Dielectric layer 81 is conveniently provided on surface 71 with openings therein extending to base contact region 77, emitter region 78 and collector contact region 80. Conductor 82 makes Ohmic contact to collector contact region 80, and conductor 83 makes Ohmic contact to base contact region 77 and emitter region 78, connecting regions 77, 78 together. Conductor 82 of transistor 40, 70 is conveniently coupled to terminal 22 and conductor 83 of transistor 40, 70 is conveniently coupled to terminal 23 of ESD circuit 20. Further N region 86 is provided in Ohmic contact with N WELL region 762. Base-collector spacing dimension D is determined by the lateral separation between boundary 752 of P Well (base) region 75 and boundary 929 of further N region 86, wherein avalanche breakdown region 84 spans portion 85 of P region 74 between boundary 752 of P WELL base region 75 and boundary 929 of further N region 86. The relative doping of the various regions is discussed in more detail in connection with FIGS. 18-28. The convention is generally followed hereafter wherein reference number 40 is used to identify transistors that have base-collector spacing dimensions D limited to central zone Z1 of FIG. 5 and reference number 70 is used to refer to transistors that have base-collector spacing dimensions D from any of zones Z1, Z2, Z3 of FIG. 5.

Figure 5:
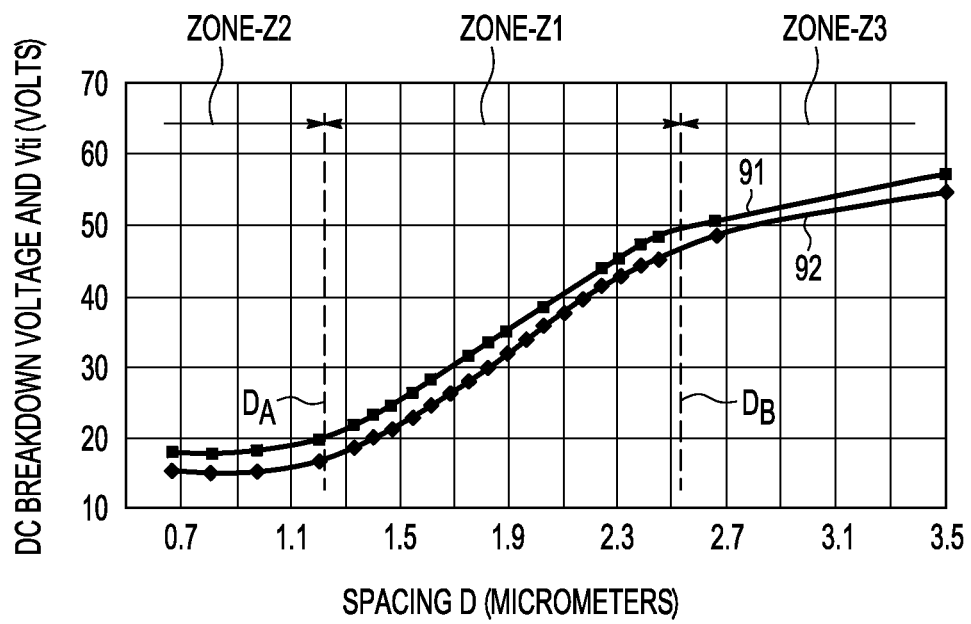
FIG. 5 is a simplified plot of DC breakdown voltage in volts as a function of lateral base-collector spacing dimension D in micrometers for the device of FIG. 4 over an extended range of spacing dimensions D.

FIG. 5 shows simplified plot 88 of AC breakdown voltage $Vt1_{AC}$ (trace 88-1) and DC breakdown voltage $Vt1_{DC}$ (trace 88-2) in volts as a function of lateral base-collector spacing dimension D in micrometers for device 40, 70 of FIG. 4 over an extended spacing range, in this example, from D less than about 0.7 micrometers to D of about 3.5 micrometers. It will be noted that the values of $Vt1_{AC}$ (trace 88-1) and $Vt1_{DC}$ (trace 88-2) are close together and have substantially identical slopes ($\Delta Vt1/\Delta D$). Plot 88 of FIG. 5 may be divided into three zones: (1) central Zone-Z1, (2) leftward peripheral Zone-Z2, and (3) rightward peripheral Zone-Z3. Zone Z1 has spacing dimensions $D_{Z1}$ corresponding to $D_A < D_{Z1} < D_B$, zone Z2 has spacing dimensions $D_{Z2}$ corresponding to $D_{Z2} < D_A$ and zone Z3 has spacing dimensions $D_{Z3}$ corresponding to $D_{Z3} > D_B$. In this example $D_A$ is about 1.2-1.3 micrometers and $D_B$ is about 2.4-2.5 micrometers, but different values may be obtained in other embodiments. Central zone Z1 corresponds to trace 61 for single ESD-Z1 device 40 of FIG. 8. Vt1 varies approximately linearly with spacing dimension $D_{Z1}$ in central zone Z1 with slope $(\Delta Vt1/\Delta D)_{Z1}$ (for both AC and DC) of about 25 volts per micrometer. It will be noted that slope $(\Delta Vt1/\Delta D)_{Z2}$ of Vt1 versus D in zone Z2, and also slope $(\Delta Vt1/\Delta D)_{Z3}$, of Vt1 versus D in zone Z3 are significantly smaller than slope $(\Delta Vt1/\Delta D)_{Z1}$ in zone Z1. For example, slope $(\Delta Vt1/\Delta D)_{Z2}$ has a value of about 0 to 3 volts per micrometers and slope $(\Delta Vt1/\Delta D)_{Z3}$ has a value of about 0 to 9 volts per micrometer, as compared with the above-noted value for slope $(\Delta Vt1/\Delta D)_{Z1}$ of about 25 volts per micrometer. Stated another way, the slope of region Z1 is at least 2 or more times greater than the slope of regions Z2 or Z3. It has been found that these differences in Vt1 versus D sensitivity in Zones Z1-Z3 can be used to provide stacked ESD devices with reduced sensitivity to variations $\Delta D$ in spacing dimension D.

Figure 6:
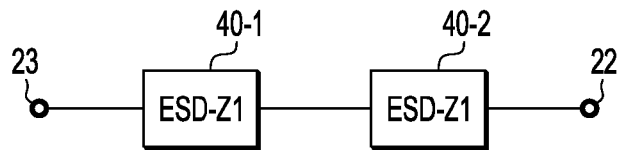
Figure 7:
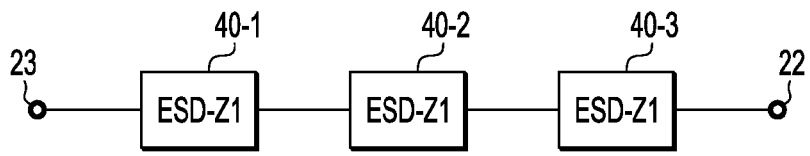
Figure 8:
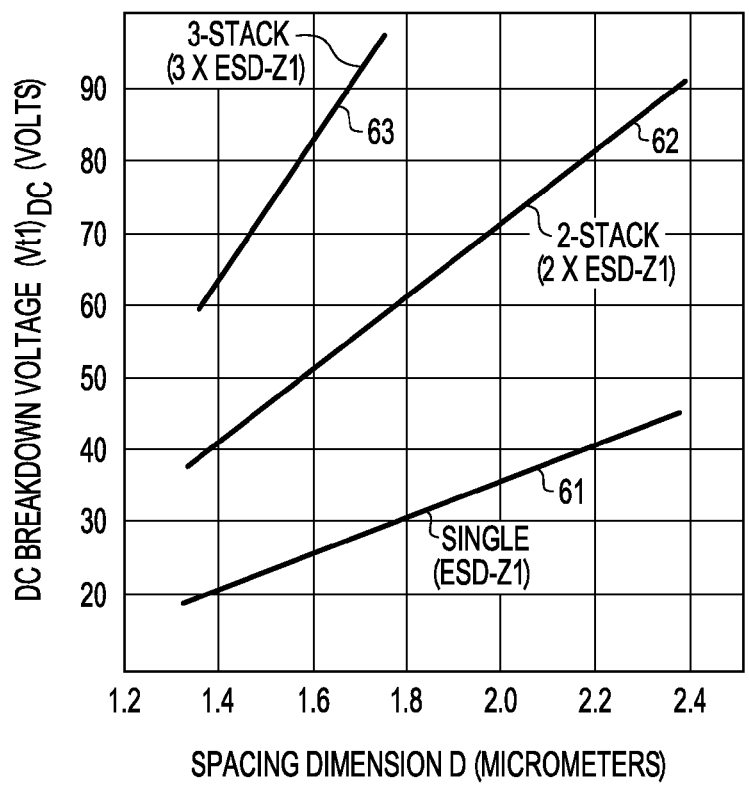
FIG. 8 is a simplified plot of DC breakdown voltage in volts as a function of lateral base-collector spacing dimension D in micrometers for different numbers of serially cascaded (stacked) ESD transistors of the type illustrated in FIG. 4 with spacing dimension D limited to zone Z1 of FIG. 5.

FIGS. 6-7 are simplified schematic diagrams of ESD clamps 65, 66 comprising serially cascaded (e.g., stacked) ESD transistors 40 of FIG. 4 all with spacing dimension D from zone Z1 of FIG. 5. FIG. 6 shows 2-stack clamp 65 and FIG. 7 shows 3-stack clamp 66. Stated another way, 2-stack ESD clamp 65 comprises two series coupled devices or transistors 21, 25 of FIGS. 1-2, wherein terminal 22 of the first transistor is coupled to terminal 23 of the second transistor, and terminal 23 of the first transistor and terminal 22 of the serially cascaded second transistor are coupled across core circuit 24, wherein transistors 40 fulfill the function of devices or transistors 21, 25 with the spacing dimensions D as noted above. Analogously, 3-stack clamp 66 comprises three serially cascaded devices 40 coupled across circuit core 24. FIG. 8 is a simplified plot of DC breakdown voltage $Vt1_{DC}$ in volts as a function of lateral base-collector spacing dimension D in micrometers, for different numbers of serially cascaded (stacked) ESD transistors 40 with base-collector spacing dimension D from zone Z1 of FIG. 5. The designation "ESD-Z1" is used to identify transistors 40 of FIG. 4 used in stacked clamp 65 and 66, indicating that they individually have the $Vt1_{DC}$ versus D characteristics illustrated by trace 61 of FIG. 8 for single ESD transistor 25, 40 with D chosen from zone Z1 of FIG. 5. Trace 61 for single type ESD-Z1 transistor shows a sensitivity of $Vt1_{DC}$ to spacing dimension D of about 25 volts per micrometer, which is substantially linear over the range from about 1.3 to about 2.4 micrometers of base-collector spacing dimension D. Accordingly, to obtain a desired value of $Vt1_{DC}$ (and the closely related value of $Vt1_{AC}$) one builds single transistor 25, 40 with the corresponding abscissa value of spacing dimension D for the desired value of $Vt1_{DC}$ shown on the ordinate. Trace 61 for single type ESD-Z1 device with slope ($\Delta Vt1_{DC}/\Delta D$) of about 25 volts per micrometer corresponds to central region Z1 of FIG. 5.

Trace 62 of FIG. 8 illustrates the variation of DC breakdown voltage Vt1DC as a function of spacing dimension D of 2-stack clamp 65 of FIG. 6 wherein each transistor 40-1, 40-2 is of type ESD-Z1 illustrated in FIG. 4 and individually having the properties illustrated by trace 61 of FIG. 8, with D chosen from central region Z1 of FIG. 5. Trace 63 of FIG. 8 illustrates the variation of DC breakdown voltage Vt1DC as a function of spacing dimension D of 3-stack clamp 66 of FIG. 7 wherein each transistor 40-1, 40-2, 40-3 is of type ESD-Z1 illustrated in FIG. 4 and individually having the properties illustrated by trace 61 of FIG. 8 with D chosen from central region Z1 of FIG. 5. In general, (Vt1)2-STACK≈(Vt1)40-1+(Vt1)40-2, and (Vt1)3-STACK≈(Vt1)40-1+(Vt1)40-2+(Vt1)40-3, etc. Serially cascading (stacking) individual ESD-Z1 transistors 40 having the response illustrated in trace 61 of FIG. 8 enables higher trigger voltages (Vt1)STACK to be obtained than would otherwise be possible with single ESD-Z1 device 40. It will also be noted that slope ($\Delta Vt1DC/\Delta D$) of the Vt1 versus D traces increases about in direct proportion to the number of transistors 40 in the stack. For example, single transistor ESD-Z1 (see trace 61 of FIG. 8) has ($\Delta Vt1DC/\Delta D$)) SINGLE-Z1 of about 25 volts per micrometers, 2-stack clamp 65 (see trace 62 of FIG. 8) has ($\Delta Vt1DC/\Delta D$)2-STACK-Z1 of about 50 volts per micrometer and 3-stack clamp 66 (see trace 63 of FIG. 8) has ($\Delta Vt1DC/\Delta D$)3-STACK-Z1 of about 75 volts per micrometer over the range of spacing dimension D illustrated in FIG. 8. Thus, by cascading individual ESD-Z1 transistors 40, a wide range of Vt1DC (and also Vt1AC) values can be obtained. This is very useful.

The variation in $Vt1_{DC}$ (and $Vt1_{AC}$) across the die or wafer for such stacked arrangements can be estimated from the slope ($\Delta Vt1_{DC}/\Delta D$) of traces 61-63 of FIG. 8. Suppose for example, that the effective variation of spacing dimension D across the die or wafer or from wafer to wafer (e.g., because of differences in azimuthal orientation) corresponds to about $\Delta D$ micrometers. Accordingly, where only a single type ESD-Z1 device is used (e.g., trace 61 of FIG. 8), then using the values for the slopes of trace 61 provided above, the variation $\Delta Vt1_{DC}$ (and $\Delta Vt1_{AC}$) across the die or wafer for a single device would be about $(\Delta Vt1)_{SINGLE-Z1} \approx \Delta D*25$ volts. This can amount to about $(\Delta Vt1)_{SINGLE-Z1} \approx 3$ to 4 volts. While such variation may be tolerable (although undesirable), the situation becomes much worse when such devices are cascaded since, as noted above, the sensitivity $\Delta Vt1$ to spacing dimension variations $\Delta D$ increases approximately in direct proportion to the number of ESD-Z1 devices 40 in the ESD stack. For example, in 2-stack clamp 65, the expected variation is about $(\Delta Vt1)_{2-STACK-Z1} \approx \Delta D*50$ volts, and for 3-stack clamp 66 the variation is about $(\Delta Vt1)_{3-STACK-Z1} \approx \Delta D*75$ volts, which can amount to about $(\Delta Vt1)_{2-STACK-Z1} \approx 6$ to 8 volts and $(\Delta Vt1)_{3-STACK-Z1} \approx 9$ to 12 volts for the same $\Delta D$ variation as described above. This is highly undesirable, especially since the use of stacked ESD devices often cannot be avoided in order to obtain Vt1 values in the desired voltage range. Accordingly, it is important to provide a means and method by which the excess sensitivity of trigger voltage Vt1 in stacked ESD devices to variations in spacing dimension D can be minimized Stated another way, it is important to be able to reduce the slope ($\Delta Vt1/\Delta D$) of the Vt1 versus spacing dimension D characteristics of multi-device stacks of ESD transistors.

Figure 9:
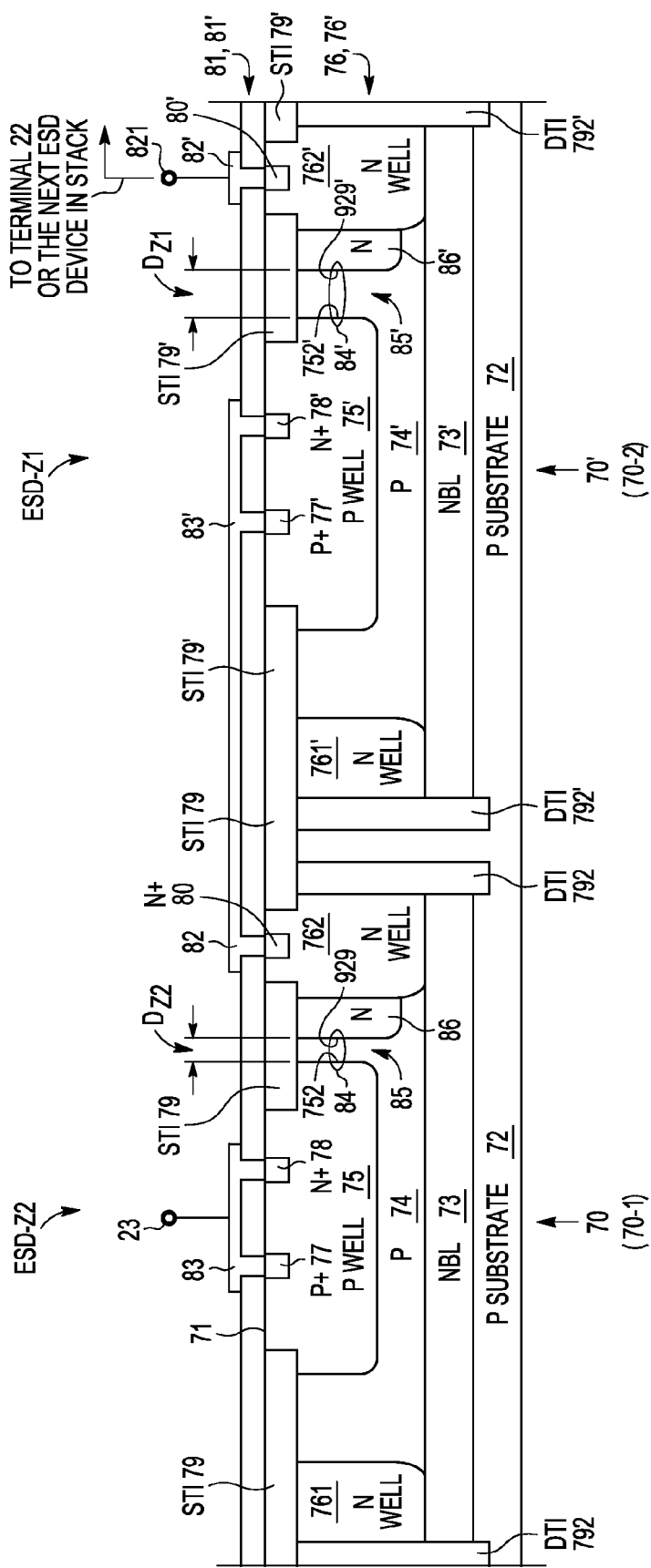
FIG. 9 shows a simplified cross-sectional view of a 2-Stack ESD clamp implemented in a semiconductor substrate according to a further embodiment of the present invention.

FIG. 9 shows a simplified cross-sectional view of illustrative 2-Stack ESD clamp 99 implemented in semiconductor substrate 72 according to a further embodiment of the invention. 2-stack ESD clamp 99 comprises two series coupled ESD transistors 70, 70' of the type illustrated in FIG. 4. The same reference numbers are used in FIG. 9 to identify the various regions of transistors 70, 70' as are used in FIG. 4, the discussion of which can be referred to for further details. A prime (') has been added to the corresponding regions of transistor 70'. (Where a third transistor is serially coupled to transistors 70, 70' of FIG. 9 to form a 3-stack clamp such as is described schematically later in FIGS. 12-15, the various regions of such third transistor 70'' can be identified by the same reference numbers as in devices 70, 70' but with a double prime ('') added thereto. To avoid unduly cluttering the drawings, such configurations are omitted in the device cross-sections.) Transistors 70, 70' have different values of spacing dimensions D, with transistor 70 in this example having spacing dimension $D_{Z2}$ between boundaries 752, 929 corresponding to Zone Z2 of FIG. 5 and transistor 70' having spacing dimension $D_{Z1}$ between boundaries 752', 929' corresponding to Zone Z1 of FIG. 5. By way of example and not intended to be limiting, ESD transistor 70' is shown at the right of FIG. 9 with collector contact conductor 82' coupled to terminal 821 leading in the case of a 2-stack to I/O terminal 22, or in the case of a 3-stack or higher to the next device in the stack. Transistor 70 is shown at the left in FIG. 9 with emitter-base contact conductor 83 coupled to GND terminal 23. Collector contact conductor 82 of transistor 70 is coupled to base-emitter contact 83' of transistor 70'. NBL regions 73, 73' are electrically isolated by central and peripheral deep trench isolation (DTI) walls 792, 792' so that transistors 70, 70' can be coupled in series to form 2-stack 99 (or a portion of a 3-stack or higher). It does not matter which of transistors 70, 70' has spacing dimension $D_{Z1}$ and which has spacing dimension $D_{Z2}$, and such spacing may be interchanged (i.e., commuted). This commutability applies to all of the $D_{Z1}$, $D_{Z2}$, $D_{Z3}$, etc., sequence variations discussed in connection with FIGS. 10-15 following. In a preferred embodiment, N WELLS 76, 76' are annular in plan view shape and laterally surround interior elements 74, 75, 77, 78, etc., and 74', 765', 77', 78', etc., respectively. In other embodiments, N WELLS 76, 76' need not be annular in plan view shape, but can terminate at dielectric isolation walls lying in planes above and below the plane of FIG. 10. Either arrangement may be used.

FIGS. 10-15 show simplified schematic diagrams of serially cascaded stacks 100-105 of ESD transistors 70 (and 70', 70'', etc.), wherein FIGS. 10-12 shows 2-stack clamps 100, 101, 102 and FIGS. 12-14 show 3-stack clamps 103, 104, 105 according to various still further embodiments of the present invention. The various ESD transistors incorporated in stacks 100-105 have spacing dimensions D corresponding to zones Z1, Z2 and/or Z3 in these examples. The convention is adopted of identifying the type of ESD transistor according to which range of D values is being used therein. For example, transistor type ESD-Z1 indicates that spacing dimension D of such transistor is chosen from zone Z1 of FIG. 5, transistor type ESD-Z2 indicates that spacing dimension D of such transistor is chosen from zone Z2 of FIG. 5, and transistor type ESD-Z3 indicates that spacing dimension D of such transistor is chosen from zone Z3 of FIG. 5. 2-stack clamp 100 of FIG. 10 shows first transistor 70-1 of type ESD Z2 with a first lead coupled to terminal 23 of circuit 20 of FIG. 1 and a second lead serially coupled to a first lead of second transistor 70-2 of type ESD-Z1 whose second lead is coupled to terminal 22 of circuit 20 of FIG. 1. The cross-sectional view illustrated in FIG. 9 corresponds to 2-stack clamp 100. 2-stack clamp 101 of FIG. 11 shows first transistor 70-3 of type ESD Z1 with a first lead coupled to terminal 23 of circuit 20 of FIG. 1 and a second lead serially coupled to a first lead of second transistor 70-4 of type ESD-Z3 whose second lead is coupled to terminal 22 of circuit 20 of FIG. 1. 2-stack clamp 102 of FIG. 12 shows first transistor 70-5 of type ESD Z2 (or type ESD-Z3, not shown) with a first lead coupled to terminal 23 of circuit 20 of FIG. 1 and a second lead serially coupled to a first lead of second transistor 70-6 of type ESD-Z3 (or type ESD-Z2, not shown) whose second lead is coupled to terminal 22 of circuit 20 of FIG. 1. The serial order of transistors 70-1, 70-2 and 70-3, 70-4 and 70-5, 70-6 in 2-stacks clamps 100-102 is not significant and they may be interchanged (commuted). Stated another way, according to various embodiments of the invention, serially coupled 2-stacks of transistors 40-$i$ and 40-$j$ desirably use any combination of type ESD-Z1, ESD-Z2, and ESD-Z3 clamp transistors except two serially coupled type ESD-Z1 transistors.

3-stack clamp 103 of FIG. 13 shows first transistor 70-7 of type ESD-Z2 with a first lead coupled to terminal 23 of circuit 20 of FIG. 1 and a second lead serially coupled to a first lead of second transistor 70-8 of type ESD-Z1 whose second lead is coupled to a first lead of third transistor 70-9 of type ESD-Z2 whose second lead is coupled to terminal 22 of circuit 20 of FIG. 1. 3-stack clamp 104 of FIG. 14 shows first transistor 70-10 of type ESD-Z1 with a first lead coupled to terminal 23 of circuit 20 of FIG. 1 and a second lead serially coupled to a first lead of second transistor 70-11 of type ESD-Z3 whose second lead is coupled to a first lead of third transistor 70-12 of type ESD-Z3 whose second lead is coupled to terminal 22 of circuit 20 of FIG. 1. 3-stack clamp 105 of FIG. 15 shows first transistor 70-13 of type ESD-Z2 with a first lead coupled to terminal 23 of circuit 20 of FIG. 1 and a second lead coupled to a first lead of second transistor 70-14 of type ESD-Z1 whose second lead is serially coupled to a first lead of third transistor 70-15 of type ESD-Z3 whose second lead is coupled to terminal 22 of circuit 20 of FIG. 1. As noted above in connection with 2-stack clamps 100-102, the order of serially coupled transistors 70-7, 70-8, 70-9 and 70-10, 70-11, 70-12 and 70-13, 70-14, 70-15 in 3-stack clamps 103-105 does not matter and the corresponding spacing dimensions $D_{Z1}$, $D_{Z2}$, $D_{Z3}$ may be commuted in such transistors. According to various embodiments of the invention, serially coupled 3-stacks of transistors 40-$i$, 40-$j$ and 40-$k$ desirably use any combination of type ESD-Z1, ESD-Z2, and ESD-Z3 clamp transistors except two or more serially coupled type ESD-Z-1 transistors. Stated another way, no more than one ESD transistor with spacing dimension D corresponding to zone Z1 should be serially coupled with at least one ESD transistor with spacing dimension D corresponding to zones Z2 and/or Z3. Stated still another way, the ESD transistor stack(s) of various embodiments of the present invention can comprise zero or one ESD transistor(s) with spacing dimension $D_{Z1}$ from zone Z1 serially coupled to one or more ESD transistors with spacing dimension $D_{Z2}$ and/or $D_{Z3}$ from zone Z2 and/or zone Z3 or both zones Z2 and/or Z3. The order of such ESD transistors in the stack is not important. While only 2-stack and 3-stack ESD clamps are illustrated in FIGS. 10-15, persons of skill in the art will understand that any number of ESD devices 70-1 ... 70-N can be stacked to obtain the desired trigger voltage $Vt1_{STACK}$.

FIG. 16 shows simplified plot 87 of DC breakdown voltage $Vt1_{DC}$ in volts as a function of lateral base-collector spacing dimension D in micrometers for different 2-stack clamps of cascaded ESD transistors, comparing the results for a 2-stack clamp of transistors 40 to the results with 2-stack clamps of transistors 70 according to embodiments of the present invention. Trace 87-1 ("2-stack Z1+Z1") shows the variation in $Vt1_{DC}$ with base-collector spacing dimension D for a 2-stack clamp having type ESD-Z1 transistors 40 with spacing dimension D chosen from zone Z1. Trace 87-1 of FIG. 16 and trace 62 of FIG. 8 show substantially the same data. Trace 87-2 and trace 87-3 show the variation in $Vt1_{DC}$ with base-collector spacing dimension D for 2-stack clamps of transistors 70 according to various embodiments of the present invention. Trace 87-2, identified as "2-stack Z1+Z2", corresponds to a 2-stack having first ESD transistor ("ESD-Z1") with spacing dimension $D_{Z1}$ chosen from zone Z1 of FIG. 5 serially coupled to second transistor ("ESD-Z2") having spacing dimension $D_{Z2}$ chosen from zone Z2 of FIG. 5. Trace 87-3, identified as "2-stack Z1+Z3", corresponds to a 2-stack having first ESD transistor ("ESD-Z1") with spacing dimension $D_{Z1}$ chosen from zone Z1 of FIG. 5 serially coupled to second transistor ("ESD-Z3") having spacing dimension $D_{Z3}$ chosen from zone Z3 of FIG. 5. Trace 87-2 corresponds to 2-stack clamp 99 of FIG. 9 and 2-stack clamp 100 of FIG. 10, and trace 87-3 corresponds to 2-stack clamp 101 of FIG. 11 according to embodiments of the present invention. Traces 87-2, 87-3 have slopes ($\Delta Vt1/\Delta D$) that are similar and about half that of trace 87-1 of 2-stack clamp 65. Since the variation $\Delta Vt1$ across the die or wafer is approximately directly proportional to slope ($\Delta Vt1/\Delta D$) of the Vt1 versus D plots, 2-stacks clamps 100, 101 of the present invention have about half the sensitivity to spacing variation $\Delta D$ as 2-stack 65. The variation $\Delta Vt1$ across the die or wafer of further 2-stack clamp 102 and 3-stack clamps 103-105 of further embodiments of the present invention is similarly proportional to the differences in slope ($\Delta Vt1/\Delta D$), and in the case of 3-stack clamps 103-105 have about one-third the $\Delta Vt1$ sensitivity to unavoidable spacing variations $\Delta D$ of 3-stack clamp 66. Thus, by choosing base-collector spacing dimensions D of the various transistors 70 used to form multi-transistor ESD stacks according to the rules explained above, the sensitivity of stacked ESD clamps to spacing variations $\Delta D$ can be significantly reduced compared to multi-transistor ESD stacks that utilize only base-collector spacing dimensions D from central zone Z1 of FIG. 5. Further, the arrangements for obtaining such reduced sensitivity to unavoidable spacing variations $\Delta D$ do not limit the range of Vt1 values than can be obtained nor significantly increase the occupied device area or add further manufacturing process steps. This is a significant advance in the art and very useful for providing a wide range of ESD trigger voltages Vt1 for ICs and other devices and circuits at no increase in cost.

Figure 17:
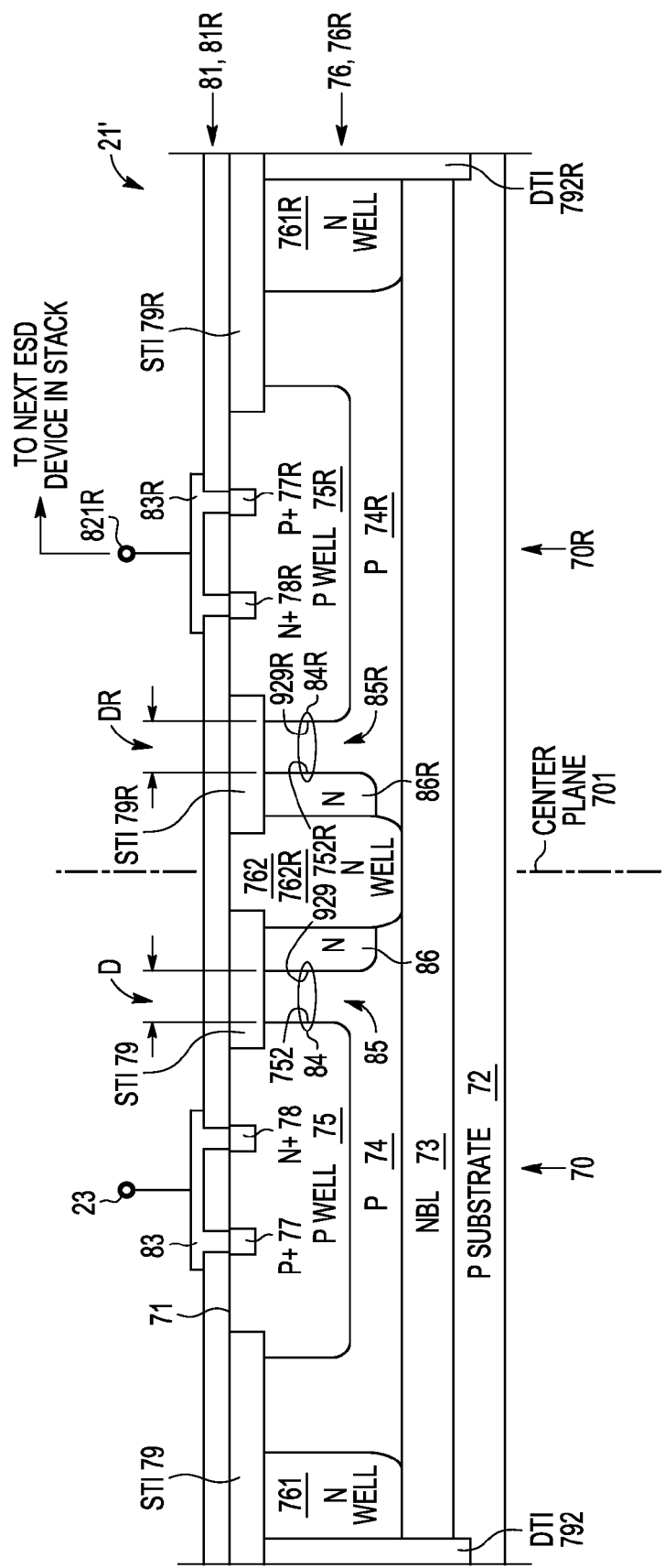
FIG. 17 shows a simplified cross-sectional view of an ESD clamp implemented in a semiconductor substrate and analogous to that of FIG. 4, but according to a yet further embodiment of the present invention wherein a bidirectional ESD function is provided.

FIG. 17 shows a simplified cross-sectional view of ESD clamp 700 implemented in semiconductor substrate 72 (e.g., P), analogous to ESD clamp transistor 70 of FIG. 4, but according to a yet further embodiment of the present invention wherein a bidirectional ESD function is provided. ESD clamp 700 comprises ESD transistor 70 (e.g., at the left in FIG. 17) of the type described in connection with FIG. 4, combined with ESD transistor 70R (e.g., at the right in FIG. 17) of the same type as ESD transistor 70 of FIG. 4 but laterally mirrored or reflected in center plane 701. The discussion of the various regions of ESD transistor 70 of FIG. 4 applies to FIG. 17 and the same reference numbers are used in connection with ESD transistor 70 at the left of FIG. 17. Analogous reference numbers are also used in connection with transistor 70R at the right of FIG. 17 modified by the addition of "R" to indicate that they are laterally reflected or mirrored in plane 701 compared to the equivalent regions in transistor 70. Thus, ESD transistor 70 of FIG. 17 (like ESD transistor 70 of FIG. 4) has P WELL region 74, N WELL regions 761, 762 (collectively 76), P+ region 77, N+ region 78, avalanche zone 84 in portion 85 of P region 74, further N region 86, STI regions 79, DTI regions 792, dielectric layer 81, conductive base-emitter contact conductor 83 and base-collector spacing dimension D between boundaries 752, 929. Contact conductor 83 is conveniently coupled to GND or common terminal 23 (see FIG. 1). ESD transistor 70R has equivalent regions 74R, 761R, 762R, 76R, 77R, 78R, 84R, 85R, 79R, 792R, 81R, 83R and base-collector spacing dimension DR between boundaries 752R and 929R, in mirror configuration to the corresponding regions in transistor 70. Substrate 72 and NBL 73 are common N WELL collector region 762 of transistor 70 and N WELL collector region 762R of transistor 70R are merged around center plane 701. Base-emitter contact conductor 83R is coupled to terminal 821R which is coupled to the next ESD device in the ESD stack. Because collector regions 672 and 672R are merged, conductor 82 of device 70 of FIG. 4 is not needed in the arrangement of device 700 of FIG. 17. For the same reason, N+ collector contact region 80 (and 80R) of device 70 of FIG. 4 is also conveniently omitted, but may be included in other embodiments.

Bi-directional ESD devices 700 are incorporated in ESD stack clamps 100-105 of FIGS. 10-15 in substantially the same manner as ESD clamps 70, wherein a first device 700-1 will have D and DR chosen, for example, from zone Z1 and a second, serially coupled device 700-2 will have D and DR chosen from Z2 or Z3 of a combination thereof depending upon the number of devices 700 being included in the stack. In further embodiments, device 700-1 and/or 700-2, etc., may be chosen from zones Z2 and/or Z3 and no transistor from zone Z1 included in the stack. All such variations are useful. The discussion associated with FIGS. 4-16 should be referred to for further details and variations according to still further embodiments of the invention wherein, for example, devices of type 700 may be substituted for any of devices 70-1 through 70-15, etc., in clamps 100-105. If base-collector spacing dimensions D and DR are substantially the same within device 700, then Vt1 will be substantially the same for both polarities of voltage applied across terminals 22, 23 of stacks 100-105 of FIGS. 10-15 comprising serially coupled devices 700-1, 700-2, etc., of FIG. 17. However, in other embodiments, wherein it is desired that Vt1 be different for different polarities, then different values may be chosen for spacing dimensions D and DR within one or more of devices 700-1, 700-2, etc.

FIGS. 18-28 are simplified cross-sectional views of ESD clamp 99 of FIG. 9 during various stages 118-128 of manufacture illustrating resulting structures 218-228, according to still yet further embodiments of the present invention and showing additional detail. As noted in connection with FIG. 9, ESD clamp 99 is formed by laterally combining and serially coupling transistors 70, 70' illustrated individually in FIG. 4 but having different base-collector spacing dimensions D. In FIG. 9, the same reference numbers as in FIG. 4 are used to identify the various regions of leftward device 70, and the same reference numbers with a prime (') added are used to identify analogous regions of rightward device 70'. This same convention is followed in FIGS. 18-28. Doping levels and/or doping doses are included in the discussion of FIGS. 18-28 by way of describing a preferred embodiment and not for limitation. Ion implantation is a preferred method of doing various regions within device 99 but is not intended to be limiting and other doping methods well known in the art may also be used. Photo resist is a suitable masking material for use with ion implant doping and is presumed in what follows unless otherwise specifically noted, but is not intended to be limiting. Persons of skill in the art will understand that other types of masking layers or materials well known in the art may also be used depending on the dopant and doping method desired to be used. Similarly, the manufacturing process is illustrated for silicon semiconductor, by way of example and not limitation. Those of skill in the art will understand that substantial modification of the choice of semiconductor material, dopants, doping methods, doping levels and/or doses and dimensions of various regions within device 99 may be made depending upon the particular device characteristics desired and that those presented herein are not intended to be limiting.

Referring now to manufacturing stage 118 of FIG. 18, initial semiconductor substrate 72i (e.g., P) is provided wherein lower portion 721 is preferably boron doped at about $5E18\ cm^{-3}$ and upper portion (e.g., EPI-1) 722 with upper surface 724 is preferably boron doped at about $2E15\ cm^{-3}$. Upper portion 722 is preferably formed by epitaxial deposition referred to, for example, as "EPI-1". Thickness 731 of EPI-1 layer 722 is conveniently in the range of about 7 to 8 micrometers, but larger or smaller thicknesses may also be used. Structure 218 results.

Referring now to manufacturing stage 119 of FIG. 19, mask 90 having closed portions 901 and open portions 902, 903 is applied over surface 724 of structure 218. Implant A is provided through open portions 902, 903 to form, respectively NBL regions 73 and 73' in substrate 72i. For silicon SC, antimony is a suitable dopant for providing NBL layers 73, 73'. A peak doping density of about $1E19\ cm^{-3}$ and thickness 731 in the range of about 1 to 2 micrometers below surface 724 is preferred but other dopants, concentrations and depths may also be used. Structure 219 results. Referring now to manufacturing stage 120 of FIG. 20, mask 90 is removed and second epitaxial layer 740 (e.g., "EPI-2") of thickness 741 of about 3 to 4 micrometers is formed on surface 724 over substrate 72i with NBLs 73, 73'. EPI-2 layer 740 is conveniently boron doped to a doping density of about $2E15\ cm^{-3}$, but larger or smaller doping levels and thicknesses may also be used. EPI-2 layer 740 has upper surface 71 and provides P regions 74. 74' of device 99. Structure 220 results, hereafter referred to as substrate 72.

Referring now to manufacturing stage 121 of FIG. 21, conventional shallow trench isolation (STI) regions 79, 79' are formed at the desired locations in surface 71 of structure 220 (substrate 72) and deep trench isolation (DTI) regions 792 are formed in substrate 72 extending, for example, to initial substrate region 721, using means well known in the art. DTI regions 792 are typically formed of grown or deposited silicon oxide or a combination thereof and may in various embodiments have a poly-silicon core (not shown) according to the available manufacturing processes. Either arrangement is useful. Peripheral DTI regions 792, 792' at the left and right, respectively, of FIG. 21 and following electrically isolate devices 70, 70' from other devices on the die. Central located DTI regions 792, 792' electrically isolates transistors 70, 70' from each other so that they may be placed electrically in series (stacked). Structure 221 results. Referring now to manufacturing stage 122 of FIG. 22, mask 91 having closed portions 911 and openings 912, 913 is applied over surface 71 of EPI-2 layer 740 of substrate 72. P-type Implant B of, for example, boron is provided through openings 912, 913 of mask 91 to form P WELLs 75, 75' having lateral boundaries 752, 752', respectively, at the indicated locations, P WELL 75 being associated with leftward device 70 and P WELL 75' being associated with rightward device 70'. P WELLs 75, 75' preferably have depth 751 from surface 71 of about 30-60 percent of EPI-2 thickness 741 and peak dopant concentration in the range of about $1E17\ cm^{-3}$ to $1E18\ cm^{-3}$ with about $4E17\ cm^{-3}$ to $8E17\ cm^{-3}$ being preferred at about 0.5 to 1.0 micrometers below surface 71, but larger and smaller depths and dopant densities and other dopants may also be used. Structure 222 results.

Referring now to manufacturing stage 123 of FIG. 23, mask 91 is removed and replaced with mask 92 having closed portions 921 and openings 922, 923, 924 and 925. N-type Implant C is provided through openings 922, 923, 924 and 925 to form N WELL regions 926, 927 associated with transistor 70 and N WELL regions 926', 927' associated with transistor 70', wherein lateral boundary 929 is associated with region 927 and boundary 929' is associated with region 927', with spacing dimension $D_{Z2}$ between boundaries 752, 929 and spacing dimension $D_{Z1}$ between boundaries 752', 929'. Phosphorous is a suitable dopant for such N WELL regions. A peak concentration in the range of about $1E17\ cm^{-3}$ to $1E18\ cm^{-3}$ is useful with about $4E17\ cm^{-3}$ to $8E17\ cm^{-3}$ being preferred, located about 1 to 1.5 micrometers beneath surface 71 and total depth 928 about 30-60 percent larger than depth 751 of P WELLs 75, 75' but less than thickness 741 of EPI-2 layer 740, but other dopants and doping densities and depths may also be used. Structure 223 results. The relative lateral location of opening 912 in mask 91 for forming P WELL region 75 in manufacturing stage 122 versus the location of opening 923 of mask 92 for forming N WELL region 927 in manufacturing stage 123 determines spacing dimension $D_{Z2}$ of device 70 of ESD clamp 99. The relative lateral location of opening 913 in mask 91 for forming P WELL region 75' in manufacturing stage 122 versus the location of opening 925 of mask 92 for forming N WELL region 927' in manufacturing stage 123 determines spacing dimension $D_{Z1}$ of device 70' of ESD clamp 99. Persons of skill in the art will understand based on the description herein that other combinations of spacings $D_{Z1}$, $D_{Z2}$, and $D_{Z3}$ may be obtained by adjusting the relative lateral locations of such P WELL and N WELL openings in masks 91, 92.

Referring now to manufacturing stage 124 of FIG. 24, mask 92 is removed and replaced with mask 93 having closed portions 931 and openings 932, 933, 934 and 935. N-type Implant D is provided through openings 932, 933, 934 and 935 to form N WELL regions 936, 937 associated with transistor 70 and N WELL regions 936', 937' associated with transistor 70'. In a preferred embodiment, openings 932, 934 of mask 93 are substantially coincident with openings 922, 924 of mask 92, but in other embodiments may differ. Again, in a preferred embodiment, openings 933 and 935 of mask 93 are narrower and lie within openings 923 and 925 of mask 92, but may have other extents in further embodiments. The purpose of mask 93 with openings 932, 933, 934 and 935 and Implant D is to extend N WELL regions 926, 927, 926', 927' formed in manufacturing stage 123 to form N WELL regions 936, 937, 936', 937' that make Ohmic contact with NBLs 73, 73'. Phosphorous is a suitable dopant for Implant D to form such N WELL regions. A first peak concentration in the range of about $5E17\ cm^{-3}$ to $2E18\ cm^{-3}$ at a first depth below surface 71 in the range of about 0.5 to 1 micrometers and a second peak concentration in the range of about $4E17\ cm^{-3}$ to $1E18\ cm^{-3}$ at a second depth below surface 71 in the range of about 1.5 to 2 micrometers and a total depth sufficient to Ohmically couple N WELL regions 936, 937, 936', 937' to NBL 73, 73' is preferred, but other dopants and doping densities and depths may also be used. Structure 224 results. N WELLS 936, 937, 936' and 937' correspond to N WELLS 761, 762, 761' and 762' of device 99 of FIG. 9 and are identified as such hereafter. The portions of N WELLs 927, 927' that extend laterally beyond N WELLs 937, 937' correspond to further N regions 86, 86' of FIG. 9, and are identified as such hereafter. Manufacturing stages 123, 124 may be performed in either order and may be performed before or after manufacturing stage 122.

Figure 25:
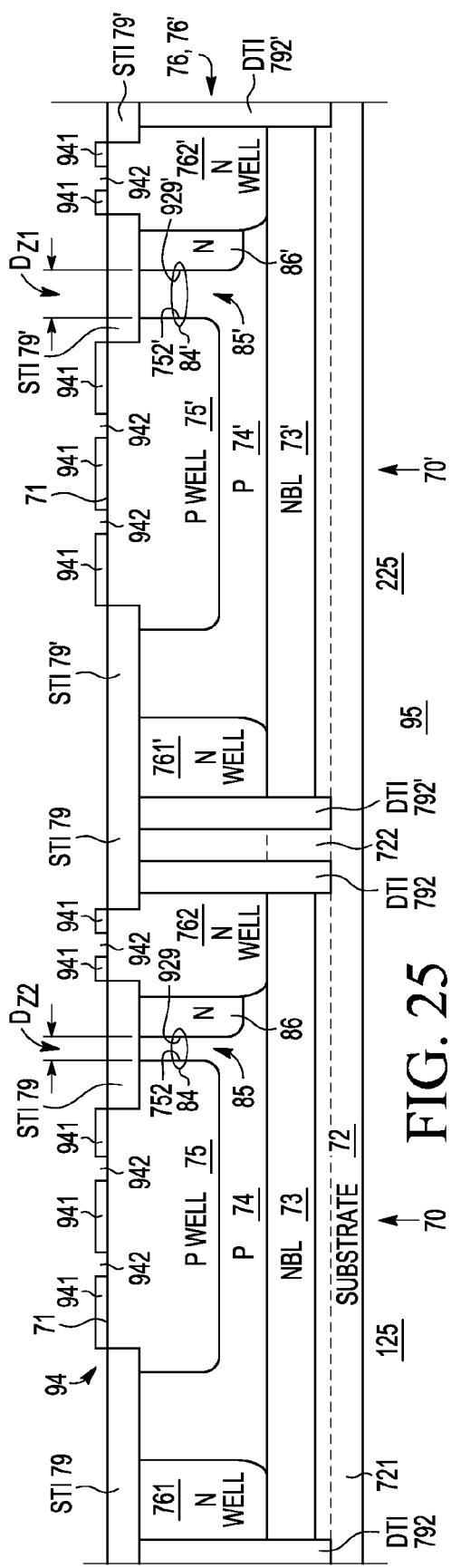

Referring now to manufacturing stage 125 of FIG. 25, mask layer 93 is removed and "silicide block" layer 94 applied over surface 71 and patterned to provide silicide block regions 941 wherever it is desired to prevent reaction between a silicide forming conductor (to be deposited later) and exposed portions of semiconductor surface 71, and openings 942 between silicide block regions 941 where it is desired for the subsequently deposited conductor to form silicides ensuring good Ohmic contact to the underlying portions of SC surfaced 71. In a preferred embodiment, silicide block layer 94 preferably comprises a first layer of silicon oxide of about 10-20 nanometers thickness overlying surface 71 followed by a second layer of silicon nitride of about 40-80 nanometers thickness overlying the first layer, but other materials and thicknesses may also be used in other embodiments. Structure 225 results. While provision of silicide block regions 941 is desirable, it may be omitted in yet further embodiments. Accordingly, in subsequent FIGS. 26-28, silicide block regions 941 are indicated by dashed lines and ignored in FIG. 10 since they become incorporated in surface dielectric layer 81, 81' applied in manufacturing stage 128.

Figure 26:
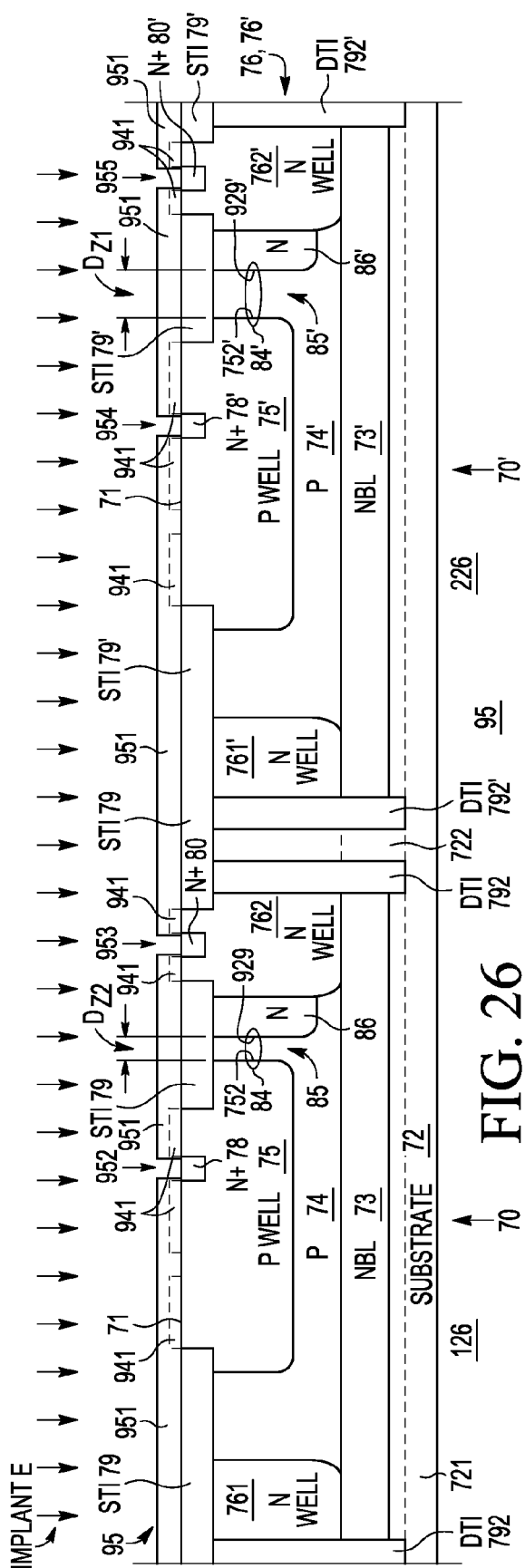

Referring now to manufacturing stage 126 of FIG. 26, mask 95 is applied over surface 71 and silicide block regions 141, mask 95 having closed portions 951 and openings 952, 953, 954, 955 corresponding to the desired locations of (e.g., N+) doped Ohmic contact and emitter regions to be formed using implant E. N-type Implant E is provided through openings 952, 953, 954, 955 wherein N+ doped emitter region 78 is formed through opening 952, N+ doped Ohmic contact region 80 is formed through opening 953, N+ doped emitter region 78' is formed through opening 954, N+ doped Ohmic contact region 80' is formed through opening 955. The dopant, energy and dose of Implant E are selected so as to provide relatively shallow highly doped N+ regions, as for example, employing arsenic dopant, with a peak concentration of about $1E20$ cm$^{-3}$ or greater and depth of about 0.2-0.3 micrometers, but other dopants and values may also be used. Structure 226 results.

Referring now to manufacturing stage 127 of FIG. 27, mask 95 is removed and mask 96 applied with closed portions 961 and openings 962, 963 corresponding to the desired locations of (e.g., P+) doped Ohmic contact regions to be formed using implant F. P-type Implant F is provided through openings 962, 963 wherein P+ doped Ohmic contact region 77 is formed through opening 962 and P+ doped Ohmic contact region 77' is formed through opening 963. The dopant, energy and dose of Implant F are selected so as to provide relatively shallow highly doped P+ regions, as for example, employing boron dopant with a peak concentration of about $1E20$ cm$^{-3}$ or greater and depth of about 0.2-0.3 micrometers, but other dopants and values may also be used. Structure 227 results.

Referring now to manufacturing stage 128 of FIG. 28, mask 96 is removed, dielectric layer 81, 81' is applied and patterned to expose those portions of doped contact or emitter regions 77, 78, 80, 77', 78', 80' where Ohmic electrical contact is desired to be made and conductors 82, 82', 83, 83' applied therein and coupled to terminals 23, 821, all using means and methods well known in the art. Structure 228 results. ESD clamp 99 is substantially complete. While manufacturing stages 118-128 have illustrated how 2-stack 100 of FIGS. 9 and 10 may be formed, persons of skill in the art will understand based on the description herein how other stacks 101-105 may be fabricated in an analogous manner using substantially the same manufacturing stages as those described herein. For example, by adjusting the relative lateral spacings and numbers of openings 912, 913, etc., of manufacturing stage 122 for producing P WELLS 75, 75', etc., versus the location and numbers of openings 923, 925, etc., of manufacturing stage 123 for producing N WELLS 927, 927' (and resulting N regions 86, 86'), the numbers of serially stacked transistors 70-$i$+70-$j$+70-$k$, etc. (where, i, j, k ... equal 1, 2, 3, ...), and their associated spacing dimensions $D_{Z1}$, $D_{Z2}$, $D_{Z3}$, etc., may be varied to yield any desired stack combination to provide the desired trigger voltage Vt1$_{STACK}$, as discussed in connection with FIGS. 10-15. It will also be appreciate based on the description herein that stacks of symmetrical devices 700 of FIG. 17 may be provided using the illustrated manufacturing stages with appropriate alterations of the various mask openings to yield the device regions and interconnections identified in FIG. 17. It should be further understood that while the manufacturing stage sequence illustrated in FIGS. 18-28 is preferred, this is intended for convenience of explanation of a preferred embodiment and not intended to be limiting, and in additional embodiments the sequence of many manufacturing stages may be interchanged. For example and not intended to be limiting, while formation of NBL 73, 73' is shown as occurring after formation of EPI-1 layer 722 and prior to formation of EPI-2 layer 740, in other embodiments, it may be formed after formation of EPI-2 layer 740. Additionally, while portions of substrate 72 including region 74, 74' are preferably formed epitaxially, in still additional embodiments, such regions may be part of an initial substrate in which devices 70, 70', 99 are subsequently formed and one or both epitaxial deposition steps (e.g., EPI-1 and/or EPI-2) may be omitted. Still further, while in the preferred embodiment, N WELLs 761, 762, 761', 762' are formed by multiple masking and implant steps, in other embodiments, such multiple masking and implant steps may be combined provided that the serially coupled ESD transistors in the ESD stack have different base-collector spacing dimensions D, with none or no more than one spacing dimension D chosen from zone Z1 and others chosen from zones Z2 and/or Z3 of FIG. 5, with the number depending upon the total number of stacked transistors being employed to achieve the desired value of Vt1$_{STACK}$. In further embodiments, DTI regions 792, 792' may be omitted and lateral isolation of ESD clamp transistors 70, 70', etc., be provided by means of N WELLS 761, 762, etc., or equivalents. Either arrangement is useful.

According to a first embodiment, there is provided an ESD clamp (21), comprising, a first bipolar transistor (ESD-Z1) having a first emitter region (78'), a first collector region (762'), a first base region (75') and a first base region to collector region spacing dimension $D_{Z1}$; and further is adapted to have a first trigger voltage Vt1$_{Z1}$ at D=$D_{Z1}$, a second bipolar transistor (ESD-Z2 or ESD-Z3) series coupled to the first bipolar transistor (ESD-Z1) and having a second emitter region (78), a second collector region (76), a second base region (75) and a second base region to collector region spacing $D_{Z2}$ or $D_{Z3}$; and further is adapted to have a second trigger voltage Vt1$_{Z2}$ or Vt1$_{Z3}$ different than the first trigger voltage Vt1$_{Z1}$, and wherein the first transistor (ESD-Z1) is adapted to have a slope ($\Delta$Vt1/$\Delta$D)$_{Z1}$ at D=$D_{Z1}$ and the second transistor (ESD-Z2 or ESD-Z3) is adapted to have a slope ($\Delta$Vt1/$\Delta$D)$_{Z2}$ at D=$D_{Z2}$ or ($\Delta$Vt1/$\Delta$D)$_{Z3}$ at D=$D_{Z3}$, and wherein ($\Delta$Vt1/$\Delta$D)$_{Z1}$ is greater than ($\Delta$Vt1/$\Delta$D)$_{Z2}$ or ($\Delta$Vt1/

ΔD)$_{Z3}$. According to a further embodiment, D$_{Z2}$ is less than D$_{Z1}$. According to a still further embodiment, the second transistor (ESD-Z2) has a second spacing D$_{Z2}$ and is adapted to have a trigger voltage Vt1$_{Z2}$ and slope (ΔVt1/ΔD)$_{Z2}$ at D=D$_{Z2}$, wherein the clamp (21) further comprises, a third bipolar transistor (ESD-Z3) serially coupled to the first bipolar transistor (ESD-Z1) and the second bipolar transistor (ESD-Z2) and having a third emitter region (78"), a third collector region (762"), a third base region (75") and a third base region to collector region spacing D$_{Z3}$, and further is adapted to have a third trigger voltage Vt1$_{Z3}$ at D=D$_{Z3}$ different than the first trigger voltage Vt1$_{Z1}$, and wherein the slope (ΔVt1/ΔD)$_{Z1}$ for the first transistor (ESD-Z1) is greater than a slope (ΔVt1/ΔD)$_{Z3}$ of the third transistor (ESD-Z3). According to a yet further embodiment, D$_{Z3}$ is greater than D$_{Z1}$. According to a still yet further embodiment, the slope (ΔVt1/ΔD)$_{Z2}$ is less than the slope (ΔVt1/ΔD)$_{Z3}$. According to a yet still further embodiment, D$_{Z2}$ is less than D$_{Z1}$. According to another embodiment, D$_{Z1}$ lies in the range 1.2-1.3<D$_{Z1}$<2.4-2.5 micrometers. According to a still another embodiment, D$_{Z2}$ is equal or less than about 1.2-1.3 micrometers. According to a yet another embodiment, D$_{Z3}$ is equal or greater than about 2.4-2.5 micrometers.

According to a second embodiment, there is provided a method for a stacked ESD clamp (100-105), comprising, providing a semiconductor substrate (72) of a first conductivity type and having an upper surface (71), forming at least a first transistor (70) having a first conductivity type first well region (75) extending a first distance (751) into the substrate (72) from the first surface (71), the first well region (75) having a first lateral edge (752) forming a portion of a base (28) of the first transistor (70), forming at least a second transistor (70') having a first conductivity type second well region (75') extending a first distance (751) into the substrate (72) from the first surface (71), the second well region (75') having a second lateral edge (752') forming a portion of a base (28) of the second transistor (70'), forming in the first transistor (70) a third well region (927) of a second opposite conductivity type extending a third distance (928) into the substrate from the first surface (71), the third well region (927) having a third lateral edge (929) separated from the first lateral edge (752) by a first spacing dimension D1, forming in the second transistor (70') a fourth well region (927') of a second opposite conductivity type extending a third distance (928) into the substrate from the first surface (71), the fourth well region (927') having a fourth lateral edge (929') separated from the second lateral edge (752') by a second spacing dimension D2, and wherein the first transistor (70) is serially coupled to the second transistor (70') and D1 is different than D2. According to a further embodiment, the first spacing dimension D1 chosen from a first zone Z1 of spacing dimensions D, wherein the first transistor (70) is adapted to have a trigger voltage Vt1$_{Z1}$ and a trigger voltage slope (ΔVt1/ΔD)$_{Z1}$ at D=D1, the second spacing dimension D2 is chosen from a second zone Z2 of spacing dimensions D, wherein the second transistor (70) is adapted to have a trigger voltage Vt1$_{Z2}$ and a trigger voltage slope (ΔVt1/ΔD)$_{Z2}$ at D=D2, and (ΔVt1/ΔD)$_{Z1}$ is at least twice (ΔVt1/ΔD)$_{Z2}$. According to a further embodiment, the method further comprises providing at least two electrically isolated buried layer regions (73, 73') of a second, opposite, conductivity type spaced from the upper surface (71), the first buried layer region (73) underlying the first transistor (70) and the second buried layer region (73') underlying the second transistor (70'). According to a still further embodiment, the method further comprises providing one or more deep trench isolation (DTI) walls (792, 792') electrically separating the first and second transistors (70, 70'). According to a yet further embodiment, D1 is in the range of about from 1.2-1.3 micrometers to about 2.4-2.5 micrometers. According to a still yet further embodiment, D2 is in the range of less than or equal about 1.2-1.3 micrometers or greater than or equal to about 2.4-2.5 micrometers.

According to a third embodiment, there is provided a stacked electrostatic discharge (ESD) protection clamp (99, 100-104) for protecting an integrated circuit (IC) or other circuit core (24), comprising, a first bipolar transistors (70-1, 700-1) adapted to have a first trigger voltage Vt1$_1$ substantially determined by a first base-collector spacing D$_1$ of the first transistor (70-1, 700-1), a second bipolar transistors (70-2, 700-2) adapted to have a second trigger voltage Vt1$_2$ substantially determined by a second base-collector spacing D$_2$ of the second transistor (70-2, 700-2) serially coupled to the first bipolar transistor (70-1, 700-1), and wherein the first transistor (70-1, 700-1) is adapted to have a first slope (ΔVt1/ΔD) of trigger voltage Vt1 versus collector-base spacing dimension D of a first value (ΔVt1/ΔD)$_1$ and the second transistor (70-2, 700-2) is adapted to have a second slope (ΔVt1/ΔD) of trigger voltage Vt1 versus collector-base spacing dimension D of a second value (ΔVt1/ΔD)$_2$, and the first (ΔVt1/ΔD)$_1$ and second (ΔVt1/ΔD)$_2$, slope values differ. According to a further embodiment, the first (ΔVt1/ΔD)$_1$ and second (ΔVt1/ΔD)$_2$, slope values differ by at least a factor of about 2. According to a still further embodiment, further comprising, a third bipolar transistors (70-3, 700-3) serially coupled to the first (70-1, 700-1) and second (70-2, 700-2) bipolar transistors, and adapted to have a third trigger voltage Vt1$_3$ substantially determined by a third base-collector spacing D$_3$ of the third transistor (70-3, 700-3), and further adapted to have a slope (ΔVt1/ΔD) of trigger voltage Vt1 versus collector-base spacing dimension D of a third value (ΔVt1/ΔD)$_3$, wherein the third value (ΔVt1/ΔD)$_3$ is less than the first value (ΔVt1/ΔD)$_1$. According to a yet further embodiment, D$_1$ lies between about 1.2-1.3 and about 2.4-2.5 micrometers and D$_2$ is less than or equal about 1.2-1.3 micrometers, or D$_1$ lies between about 1.2-1.3 and about 2.4-2.5 micrometers and D$_2$ is greater than or equal about 2.4-2.5 micrometers, or D$_1$ is less than or equal about 1.2-1.3 micrometers and D$_2$ is greater than or equal about 2.4-2.5 micrometers, or D$_1$ is less than or equal about 1.2-1.3 micrometers and D$_2$ is less than or equal about 1.2-1.3 micrometers, or D$_1$ is greater than or equal about 2.4-2.5 micrometers and D$_2$ is greater than or equal about 2.4-2.5 micrometers. According to a still yet further embodiment, the first transistor (700-1) comprises a first serially coupled mirrored pair of first transistors (70, 70R) having base-collector spacing dimension D$_1$ and DR$_1$, respectively, and the second transistor (700-2) comprises a second serially coupled mirrored pair of first transistors (70', 70R') having base-collector spacing dimension D$_2$ and DR$_2$, respectively, wherein D$_1$ and DR$_1$ are different than D$_2$ and DR$_2$.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for producing a stacked electrostatic discharge (ESD) clamp, comprising:
   providing a semiconductor substrate of a first conductivity type and having an upper surface;
   forming at least a first transistor having a first conductivity type first well region extending a first distance into the substrate from the first surface, the first well region having a first lateral edge forming a portion of a base of the first transistor;
   forming at least a second transistor having a first conductivity type second well region extending a first distance into the substrate from the first surface, the second well region having a second lateral edge forming a portion of a base of the second transistor;
   forming in the first transistor a third well region of a second opposite conductivity type extending a third distance into the substrate from the first surface, the third well region having a third lateral edge separated from the first lateral edge by a first spacing dimension D1;
   forming in the second transistor a fourth well region of a second opposite conductivity type extending a third distance into the substrate from the first surface, the fourth well region having a fourth lateral edge separated from the second lateral edge by a second spacing dimension D2; and
   wherein the first transistor is serially coupled to the second transistor and D1 is different than D2;
   wherein the first spacing dimension D1 is chosen from a first zone Z1 of spacing dimensions D, the first transistor adapted to have a trigger voltage $Vt1_{Z1}$ and a trigger voltage slope $(\Delta Vt1/\Delta D)_{Z1}$ at D=D1;
   wherein the second spacing dimension D2 is chosen from a second zone Z2 of spacing dimensions D, the second transistor adapted to have a trigger voltage $Vt1_{Z2}$ and a trigger voltage slope $(\Delta Vt1/\Delta D)_{Z2}$ D=D2; and
   wherein $(\Delta Vt1/\Delta D)_{Z1}$ is at least twice $(\Delta Vt1/\Delta D)_{Z2}$.

2. The method of claim 1, further comprising forming at least two electrically isolated buried layer regions of a second, opposite conductivity type spaced from the upper surface, the first buried layer region underlying the first transistor and the second buried layer region underlying the second transistor.

3. The method of claim 1, further comprising, providing one or more deep trench isolation walls electrically separating the first and second transistors.

4. The method of claim 1, wherein D1 is in the range of about from 1.2-1.3 micrometers to about 2.4-2.5 micrometers.

5. The method of claim 4, wherein D2 is in the range of less than or equal about 1.2-1.3 micrometers or greater than or equal to about 2.4-2.5 micrometers.

6. A method for producing a stacked electrostatic discharge (ESD) clamp, comprising:
   forming a first bipolar transistor having a first emitter region, a first collector region, a first base region and a first base region to collector region spacing dimension $D_{Z1}$, the first bipolar transistor having a first trigger voltage $Vt1_{Z1}$ at D=$D_{Z1}$; and
   forming a second bipolar transistor series coupled to the first bipolar transistor and having a second emitter region, a second collector region, a second base region and a second base region to collector region spacing $D_{Z2}$ or $D_{Z3}$, the second bipolar transistor having a second trigger voltage $Vt1_{Z2}$ or $Vt1_{Z3}$ different than the first trigger voltage $Vt1_{Z1}$;
   wherein the first bipolar transistor is adapted to have a slope $(\Delta Vt1/\Delta D)_{Z1}$ at D=$D_{Z1}$ and the second bipolar transistor is adapted to have a slope $(\Delta Vt1/\Delta D)_{Z2}$ at D=$D_{Z2}$ or $(\Delta Vt1/\Delta D)_{Z3}$ at D=$D_{Z3}$, and wherein $(\Delta Vt1/\Delta D)_{Z1}$ is greater than $(\Delta Vt1/\Delta D)_{Z2}$ or $(\Delta Vt1/\Delta D)_{Z3}$.

7. The method of claim 6, wherein $D_{Z2}$ is less than $D_{Z1}$.

8. The method of claim 6, wherein the second transistor has a second spacing $D_{Z2}$ and is adapted to have a trigger voltage $Vt1_{Z2}$ and slope $(\Delta Vt1/\Delta D)_{Z2}$ at D=$D_{Z2}$, wherein the method further comprises:
   forming a third bipolar transistor serially coupled to the first bipolar transistor and the second bipolar transistor and having a third emitter region, a third collector region, a third base region and a third base region to collector region spacing $D_{Z3}$, and further is adapted to have a third trigger voltage $Vt1_{Z3}$ at D=$D_{Z3}$ different than the first trigger voltage $Vt1_{Z1}$; and
   wherein the slope $(\Delta Vt1/\Delta D)_{Z1}$ for the first transistor is greater than the slope $(\Delta Vt1/\Delta D)_{Z3}$ for the third transistor.

9. The method of claim 8, wherein $D_{Z3}$ is greater than $D_{Z1}$.

10. The method of claim 8, wherein the slope $(\Delta Vt1/\Delta D)_{Z2}$ is less than the slope $(\Delta Vt1/\Delta D)_{Z3}$.

11. The method of claim 8, wherein $D_{Z2}$ is less than $D_{Z1}$.

12. The method of claim 6, wherein $D_{Z1}$ lies in the range 1.2-1.3<$D_{Z1}$<2.4-2.5 micrometers.

13. The method of claim 6, wherein $D_{Z2}$ is equal or less than about 1.2-1.3 micrometers.

14. The method of claim 9, wherein $D_{Z3}$ is equal or greater than about 2.4-2.5 micrometers.

15. A method for producing a stacked electrostatic discharge (ESD) clamp for protecting an integrated circuit or other circuit core, comprising:
   fabricating at least a first bipolar transistor adapted to have a first trigger voltage $Vt1_1$ substantially determined by a first base-collector spacing $D_1$ of the first transistor;
   fabricating at least a second bipolar transistor adapted to have a second trigger voltage $Vt1_2$ substantially determined by a second base-collector spacing $D_2$ of the second transistor serially coupled to the first bipolar transistor; and
   wherein the first bipolar transistor is adapted to have a first slope $(\Delta Vt1/\Delta D)$ of trigger voltage Vt1 versus collector-base spacing dimension D of a first value $(\Delta Vt1/\Delta D)_1$ and the second bipolar transistor is adapted to have a second slope $(\Delta Vt1/\Delta D)$ of trigger voltage Vt1 versus collector-base spacing dimension D of a second value $(\Delta Vt1/\Delta D)_2$, and the first $(\Delta Vt1/\Delta D)_1$ and second $(\Delta Vt1/\Delta D)_2$, slope values differ.

16. The method of claim 15, wherein the first $(\Delta Vt1/\Delta D)_1$ and second $(\Delta Vt1/\Delta D)_2$, slope values differ by at least a factor of about 2.

17. The method of claim 15, further comprising:
   fabricating a third bipolar transistors serially coupled to the first and second bipolar transistors, and adapted to have a third trigger voltage $Vt1_3$ substantially determined by a third base-collector spacing $D_3$ of the third transistor, and further adapted to have a slope $(\Delta Vt1/\Delta D)$ of trigger voltage Vt1 versus collector-base spacing dimension D of a third value $(\Delta Vt1/\Delta D)_3$, wherein the third value $(\Delta Vt1/\Delta D)_3$ is less than the first value $(\Delta Vt1/\Delta D)_1$.

18. The method of claim 15, wherein:
   $D_1$ lies between about 1.2-1.3 and about 2.4-2.5 micrometers and $D_2$ is less than or equal about 1.2-1.3 micrometers; or
   $D_1$ lies between about 1.2-1.3 and about 2.4-2.5 micrometers and $D_2$ is greater than or equal about 2.4-2.5 micrometers; or $D_1$ is less than or equal about 1.2-1.3 micrometers and $D_2$ is greater than or equal about 2.4-2.5 micrometers; or $D_1$ is less than or equal about 1.2-1.3 micrometers and $D_2$ is less than or equal about 1.2-1.3 micrometers; or $D_1$ is greater than or equal about 2.4-2.5 micrometers and $D_2$ is greater than or equal about 2.4-2.5 micrometers.

19. The method of claim 15, wherein fabricating at least a first bipolar transistor comprises fabricating first serially coupled mirrored pair of first transistors having base-collector spacing dimension $D_1$ and $DR_1$, respectively, and wherein fabricating at least a second bipolar transistor comprises fabricating a second serially coupled mirrored pair of first transistors having base-collector spacing dimension $D_2$ and $DR_2$, respectively, wherein $D_1$ and $DR_1$ are different than $D_2$ and $DR_2$.

* * * * *